(12) United States Patent
Yamazaki et al.

(10) Patent No.: US 8,178,398 B2
(45) Date of Patent: May 15, 2012

(54) MANUFACTURING METHOD OF DISPLAY DEVICE

(75) Inventors: Shunpei Yamazaki, Setagaya (JP); Yasuyuki Arai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 334 days.

(21) Appl. No.: 12/219,244

(22) Filed: Jul. 18, 2008

(65) Prior Publication Data
US 2009/0029498 A1 Jan. 29, 2009

(30) Foreign Application Priority Data
Jul. 27, 2007 (JP) ................................. 2007-196189

(51) Int. Cl.
*H01L 21/00* (2006.01)
(52) U.S. Cl. ................. 438/149; 438/151; 257/E51.005; 118/723 MW
(58) Field of Classification Search .................. 438/149, 438/150, 151; 257/E51.005; 118/723 MW
See application file for complete search history.

(56) References Cited

U.S. PATENT DOCUMENTS

| | | | |
|---|---|---|---|
| 4,409,134 A | 10/1983 | Yamazaki | |
| 4,505,950 A | 3/1985 | Yamazaki | |
| 4,760,008 A | 7/1988 | Yamazaki et al. | |
| 4,988,642 A | 1/1991 | Yamazaki | |
| 5,453,858 A | 9/1995 | Yamazaki | |
| 5,514,879 A | 5/1996 | Yamazaki | |
| 5,591,987 A | 1/1997 | Yamazaki et al. | |
| 5,614,732 A | 3/1997 | Yamazaki | |
| 5,701,167 A | 12/1997 | Yamazaki | |
| 5,849,601 A | 12/1998 | Yamazaki | |
| 5,859,445 A | 1/1999 | Yamazaki | |
| 5,932,302 A | 8/1999 | Yamazaki et al. | |
| 5,968,274 A | 10/1999 | Fujioka et al. | |
| 6,011,277 A | 1/2000 | Yamazaki | |

(Continued)

FOREIGN PATENT DOCUMENTS

JP  62-062073  3/1987

(Continued)

OTHER PUBLICATIONS

Arai. T et al. "41.2: Micro Silicon Technology for Active Matrix Oled Display," SID Digest '07: SID International Symposium Digest of Technical Papers, vol. XXXVIII, 2007, pp. 1370-1373.

*Primary Examiner* — Khiem D Nguyen
(74) *Attorney, Agent, or Firm* — Eric J. Robinson; Robinson Intellectual Property Law Office, P.C.

(57) ABSTRACT

To improve a deposition rate of a microcrystalline semiconductor layer by using a deposition method and to improve productivity of a display device including a TFT of a microcrystalline semiconductor, a reactive gas containing helium is supplied to a treatment chamber surrounded with a plurality of juxtaposed waveguides and a wall surface; a microwave is supplied to a space which is interposed between juxtaposed waveguides to generate plasma while the pressure of the treatment chamber is held at an atmospheric pressure or a sub-atmospheric pressure typically a pressure of $1\times10^2$ Pa or more and $1\times10^5$ Pa or less; and a microcrystalline semiconductor layer is deposited over a substrate placed in the treatment chamber. High density plasma is generated by providing slits on sides of the plurality of juxtaposed waveguides which face to another waveguide and supplying a microwave into the treatment chamber through the slit.

26 Claims, 31 Drawing Sheets

U.S. PATENT DOCUMENTS

| | | | |
|---|---|---|---|
| 6,023,075 | A | 2/2000 | Yamazaki |
| 6,171,674 | B1 | 1/2001 | Yamazaki et al. |
| 6,183,816 | B1 | 2/2001 | Yamazaki et al. |
| 6,252,249 | B1 | 6/2001 | Yamazaki |
| 6,281,520 | B1 | 8/2001 | Yamazaki |
| 6,306,213 | B1 | 10/2001 | Yamazaki |
| 6,468,617 | B1 | 10/2002 | Yamazaki et al. |
| 6,737,123 | B2 | 5/2004 | Kondo et al. |
| 6,737,676 | B2 | 5/2004 | Yamazaki |
| 6,835,523 | B1 | 12/2004 | Yamazaki et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,211,454 | B2 | 5/2007 | Yamazaki et al. |
| 7,229,862 | B2 | 6/2007 | Yamazaki et al. |
| 7,301,215 | B2 | 11/2007 | Kariya |
| 7,432,468 | B2 | 10/2008 | Oka et al. |
| 7,520,245 | B2 | 4/2009 | Ohmi et al. |
| 2003/0062129 | A1 | 4/2003 | Ni |
| 2004/0209005 | A1* | 10/2004 | Goto et al. .................... 427/579 |
| 2005/0012887 | A1* | 1/2005 | Koyama et al. ............... 349/151 |
| 2005/0022864 | A1 | 2/2005 | Fujioka et al. |
| 2005/0089648 | A1* | 4/2005 | Yamazaki et al. ............ 427/569 |
| 2006/0225656 | A1* | 10/2006 | Horiguchi ............. 118/723 MW |
| 2006/0238132 | A1 | 10/2006 | Kitamura et al. |
| 2006/0246738 | A1 | 11/2006 | Isobe et al. |
| 2006/0275710 | A1* | 12/2006 | Yamazaki et al. ............ 430/313 |
| 2007/0018165 | A1 | 1/2007 | Yamazaki |
| 2007/0057258 | A1 | 3/2007 | Fukuchi et al. |
| 2007/0120785 | A1 | 5/2007 | Kimura |
| 2007/0163996 | A1 | 7/2007 | Horiguchi |
| 2008/0213504 | A1 | 9/2008 | Ishikawa |
| 2008/0299689 | A1 | 12/2008 | Yamazaki |
| 2009/0047752 | A1 | 2/2009 | Yamazaki et al. |

FOREIGN PATENT DOCUMENTS

| | | |
|---|---|---|
| JP | 62-062073 B2 | 12/1987 |
| JP | 02-053941 | 2/1990 |
| JP | 02-053941 B2 | 11/1990 |
| JP | 11-103082 A | 4/1999 |
| JP | 2000-277439 | 10/2000 |
| JP | 2004-014958 | 1/2004 |
| JP | 2005-049832 | 2/2005 |
| JP | 2007-005705 | 1/2007 |
| JP | 2007-048982 | 2/2007 |

* cited by examiner

MANUFACTURING METHOD OF DISPLAY DEVICE

BACKGROUND OF THE INVENTION

1. Field of the Invention

The present invention relates to a manufacturing method of a microcrystalline semiconductor and a manufacturing method of a display device including a thin film transistor formed of a microcrystalline semiconductor.

2. Description of the Related Art

A thin film transistor (hereinafter also referred to as a "TFT") has widely been used, already in a liquid crystal display application. A TFT is a kind of field-effect transistor, where a semiconductor which forms a channel is formed of a thin film. As for a semiconductor layer which forms a channel, there are a semiconductor layer formed of amorphous silicon and a semiconductor layer formed of polycrystalline silicon. The former has been used for a large-screen panel of a liquid crystal television or the like, and the latter has been used for a miniaturized and high definition monitor screen of a cellular phone or the like.

Meanwhile, microcrystalline silicon is a material which has been known for a long time along with amorphous silicon, and microcrystalline silicon related to a field-effect transistor was reported in 1980s (for example, see Patent Document 1: U.S. Pat. No. 5,591,987). However, a TFT using microcrystalline silicon has been buried between an amorphous-silicon transistor and a polycrystalline silicon transistor up to today; thus, there has been a delay in practical use thereof. Microcrystalline silicon was reported at an academic society level (for example, see Non-Patent Document 1; Toshiaki Arai et al., SID 07 DIGEST, 2007, pp. 1370-1373).

SUMMARY OF THE INVENTION

A microcrystalline silicon film is formed by a chemical vapor deposition method (a plasma CVD method) utilizing plasma, with a silicon hydride gas such as silane diluted with mass volume of hydrogen. In this case, even if a film formation condition is optimized, a deposition rate of a microcrystalline silicon film has been less than or equal to 0.1 nm/second. In a TFT which needs a film thickness of approximately 100 nm or more, it is not practical to employ a process with such a low deposition rate. In other words, there has been a problem in that the productivity of the microcrystalline silicon TFT is worse than that of an amorphous-silicon TFT.

The present invention solves such a problem. It is an object thereof to improve a deposition rate of a microcrystalline semiconductor layer which is formed by a vapor deposition method and to improve productivity of a display device including a TFT formed of a microcrystalline semiconductor. In addition, it is another object of the present invention to provide a manufacturing apparatus which manufactures TFTs of a microcrystalline semiconductor.

A manufacturing apparatus is provided with a unit for supplying a reactive gas containing helium to a treatment chamber which is provided with a plurality of juxtaposed waveguides and a wall surface, and the like. In the manufacturing apparatus, a reactive gas containing helium is supplied, a microwave is supplied to a space which is interposed between juxtaposed waveguides to generate plasma while the pressure of the treatment chamber is held at an atmospheric pressure or a sub-atmospheric pressure, and a microcrystalline semiconductor layer formed of a microcrystalline semiconductor is deposited over a substrate which is placed in the treatment chamber. As for the reactive gas, a semiconductor material gas and a dilution gas are contained in addition to helium.

A slit is provided on each of sides of the plurality of juxtaposed waveguides, which face to another waveguide, and a microwave is supplied into the treatment chamber through the slits. Accordingly, plasma is generated. The plasma which is generated in such a manner is stable. At generation of plasma, the pressure of the treatment chamber is an atmospheric pressure or a sub-atmospheric pressure, and a pressure of $1 \times 10^2$ Pa or more and $1 \times 10^5$ Pa or less (1 Torr or more and 760 Torr or less) is typically applied. With the use of plasma which is stabilized, hydrogen is reacted with a silicon hydride gas or a silicon halide gas at the pressure of $1 \times 10^2$ Pa or more and $1 \times 10^5$ Pa or less (1 Torr or more and 760 Torr or less); thus, a microcrystalline semiconductor layer is formed. Since high-density plasma can be generated stably in a space which is interposed between the juxtaposed waveguides, the microcrystalline semiconductor layer of the present invention can be formed even at a pressure of approximately $1 \times 10^2$ Pa or more and $1 \times 10^5$ Pa or less.

A microcrystalline semiconductor layer contains a minute crystalline structure in a semiconductor film, has a third state which is stable in terms of free energy, and is a crystalline substance having short-range order and lattice distortion. The size of the crystal is 2 to 100 nm. The crystal can be observed as a columnar shape or a conic shape in an electronic microscope. When the microcrystalline semiconductor layer has lattice distortion and, for example, a microcrystalline silicon film is observed by Raman spectroscopy, a Raman peak can be observed between a wavenumber 520.7 $cm^{-1}$ of single-crystal silicon and a wavenumber 480 $cm^{-1}$ of amorphous silicon, typically between a wavenumber 514 $cm^{-1}$ and a wavenumber 519 $cm^{-1}$; thus, it is found that there is lattice distortion. Further, hydrogen or halogen may be contained so as to compensate a dangling bond. Note that at least 1 atomic % or more of hydrogen or halogen is contained. There is also a microcrystalline semiconductor in which lattice distortion is further promoted by containing a rare gas such as helium, argon, krypton, or neon.

By setting a pressure at deposition of a microcrystalline semiconductor as an atmospheric pressure or a sub-atmospheric pressure and generating stable microwave plasma, a microcrystalline semiconductor can be formed without reducing a deposition rate. A TFT can be manufactured with such a microcrystalline semiconductor layer. A TFT having a channel formed of a microcrystalline semiconductor layer is superior to an amorphous-silicon TFT in electric characteristics. According to the present invention, productivity is not impaired in manufacturing a display device even with the TFT having a channel formed of a microcrystalline semiconductor layer. A microcrystalline semiconductor layer of the present invention can be formed at a deposition rate which is approximately 50 times as high as a deposition rate of a conventional microcrystalline semiconductor layer.

DETAILED DESCRIPTION OF THE INVENTION

Embodiment Modes

Figure 1:
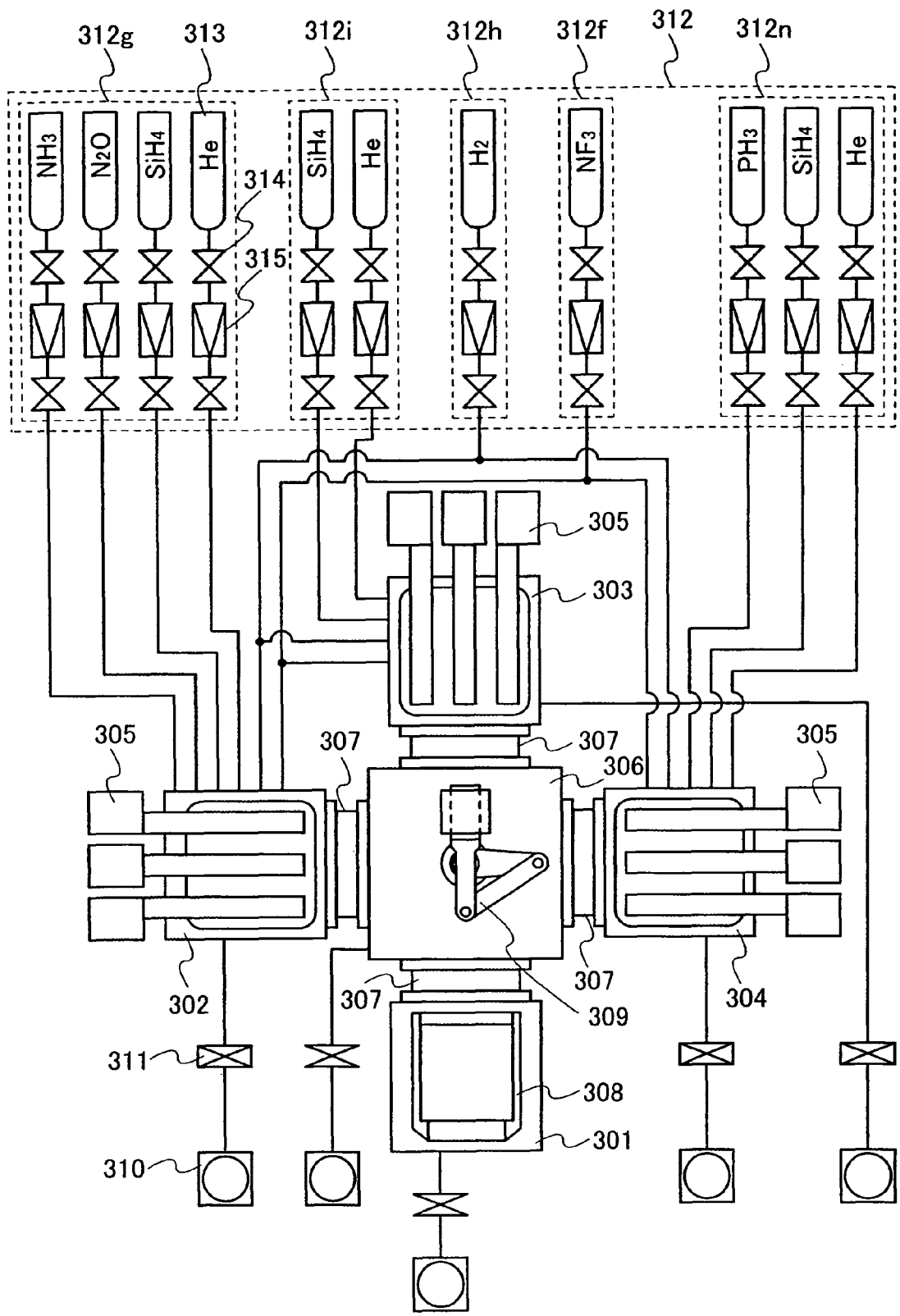
FIG. 1 is a view showing a structure of a multi-chamber microwave plasma CVD apparatus provided with a plurality of treatment chambers.

Embodiment modes of the present invention will be described below with reference to the accompanying drawings. Note that the present invention is not limited to the description below, and it is easily understood by those skilled in the art that modes and details can be modified in various ways without departing from the purpose and the scope of the present invention. Accordingly, the present invention should not be interpreted as being limited to the description of the embodiment modes below. Note that like portions in the drawings may be denoted by the like reference numerals in structures of the present invention.

(Structural Example of Multi-Chamber Microwave Plasma CVD Apparatus)

A microcrystalline semiconductor layer is formed by a plasma CVD method. In this embodiment mode, an atmospheric pressure or a sub-atmospheric pressure is applied as a film formation condition of a microcrystalline semiconductor layer. The range of $1\times10^2$ Pa or more and $1\times10^5$ Pa or less (1 Torr or more and 760 Torr or less) is typical as the pressure. Plasma which is generated at the pressure preferably has an electron density of $1\times10^{11}$ cm$^{-3}$ or more and $1\times10^{13}$ cm$^{-3}$ or less and an electron temperature of approximately 0.2 eV or more and 2.0 eV or less (more preferably, 0.5 eV or more and 1.5 eV or less). Since plasma damage is small when plasma with a high electron density and a low electron temperature is utilized, a microcrystalline semiconductor layer with few defects and high quality can be formed.

In order to generate such plasma, microwave power is preferably supplied to a treatment chamber of a plasma CVD apparatus. Microwave power may be supplied to the treatment chamber through a waveguide in order to make high-density plasma act also on a large-area mother glass substrate like a glass substrate for liquid crystal displays. As a structure of the treatment chamber, a plurality of waveguides are juxtaposed and a slit is provided in each waveguide. The slit is provided on each of sides of the neighboring waveguides, which face to another waveguide, so that a microwave leaks. A microwave is supplied in a space which is interposed between the juxtaposed waveguides to generate plasma, and the plasma is made to act on hydrogen and a silicon hydride gas or a silicon halide gas which is diluted. Accordingly, a microcrystalline semiconductor layer can be formed. An example of an apparatus suitable for formation of a microcrystalline semiconductor layer is described below.

FIG. 1 shows an example of a multi-chamber microwave plasma CVD apparatus provided with a plurality of treatment chambers. As a structure, the apparatus includes a common chamber 306, a load/unload chamber 301, a first treatment chamber 302, a second treatment chamber 303, and a third treatment chamber 304. The plasma CVD apparatus is a single-wafer type in which an element substrate placed in a cassette 308 of the load/unload chamber 301 is carried in and out from treatment chambers by a transport mechanism 309 of the common chamber 306. A gate valve 307 is provided between the common chamber 306 and each chamber so that treatment which is performed in each treatment chamber does not interfere with each other. Treatment chambers are classified depending on a kind of thin film. For example, an insulating film such as a gate insulating film is formed in the first treatment chamber 302, a microcrystalline semiconductor layer which forms a channel is formed in the second treatment chamber 303, and an impurity semiconductor layer of one conductivity type which forms a source and a drain is formed in the third treatment chamber 304. Needless to say, the number of treatment chambers is not limited to three and can be increased or reduced arbitrarily as needed. In addition, one film may be formed in one treatment chamber as described above, or alternatively a plurality of films may be formed in one treatment chamber.

The air in each treatment chamber is replaced with an inert gas or a nitrogen gas. A gas supply means 312 and an evacuation means 310 are connected to each treatment chamber so that a reactive gas can be made to flow at a pressure of approximately $1 \times 10^2$ Pa or more and $1 \times 10^5$ Pa or less. Since film formation with this apparatus is performed at an atmospheric pressure or a sub-atmospheric pressure, the evacuation means 310 preferably has high suction and evacuation capability. A switching valve 311 is provided between the evacuation means 310 and each of the treatment chambers to be able to control an evacuation speed.

The gas supply means 312 includes a cylinder 313, a valve 314, a mass flow controller 315, and the like. The cylinder 313 is filled with a gas which is used in a process, which includes a semiconductor material gas, a rare gas, and the like. When helium is used as a rare gas, plasma can be stably generated. A gas supply means 312g is connected to the first treatment chamber 302 and supplies a gas for treatment for forming a gate insulating film. A gas supply means 312i is connected to the second treatment chamber 303 and supplies a gas for an i-type semiconductor layer which forms a channel. A gas supply means 312n is connected to the third treatment chamber 304 and supplies a gas for an n-type semiconductor layer which forms a source and a drain. A gas supply means 312h supplies hydrogen, and a gas supply means 312f supplies an etching gas which is used for cleaning the inside of the treatment chambers, and these gas supply means are provided as lines shared by the treatment chambers.

Each treatment chamber is provided with a plasma generation means 305, and the plasma generation means 305 includes an oscillator which generates plasma in the treatment chamber. For example, the plasma generation means 305 includes a microwave power supply, a microwave amplifier, a waveguide which leads a microwave to the treatment chamber, and the like. Each treatment chamber has one or a plurality of the plasma generation means 305. The number of plasma generation means 305 may be determined so that uniformity of a film which is formed over a substrate to be treated is ensured.

Figure 2:
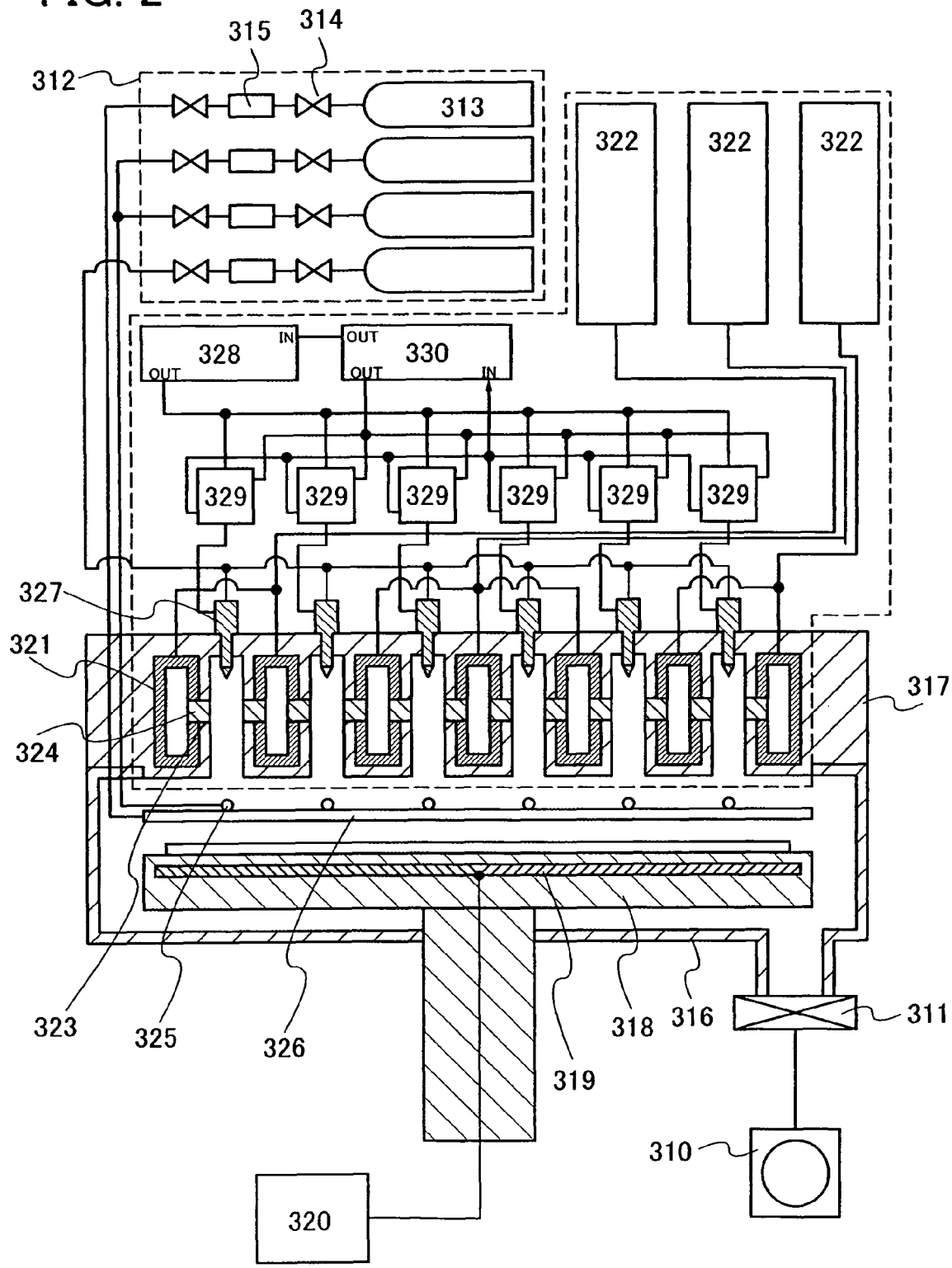
FIG. 2 is a view showing a structure of a treatment chamber in a multi-chamber microwave plasma CVD apparatus provided with a plurality of treatment chambers.

FIG. 2 is a cross-sectional view for describing an example of a treatment chamber. The treatment chamber includes a treatment container 316 and a cover 317. The treatment container 316 has a wall surface, and the cover 317 includes a plurality of juxtaposed waveguides 321. With a sealed structure using the treatment container 316 and the cover 317, the pressure of the treatment chamber can be kept at approximately $1 \times 10^2$ Pa or more and $1 \times 10^5$ Pa or less. The treatment container 316 is formed of, for example, a metal such as stainless steel or aluminum. The treatment chamber, in which a sealed space is formed with the cover 317 and the treatment container 316, is provided with the gas supply means 312 so that the air in the treatment chamber can be replaced with an inert gas or a nitrogen gas. The evacuation means 310 which is connected to the treatment chamber can evacuate a gas supplied to the treatment chamber. The air in the treatment chamber may be evacuated in order to replace the atmosphere. In this case, the evacuation means 310 may consist of a vacuum pump.

A susceptor 318 in which an object to be processed such as the substrate is placed is provided in the treatment container 316. The susceptor 318 is formed of a ceramic material such as aluminum nitride, silicon nitride, or silicon carbide. A heater 319 is provided inside the susceptor 318. The heater 319 is connected to a heater power supply 320. The heater 319 is embedded in the susceptor 318 and generates heat by being supplied with power from the heater power supply 320. The heater 319 keeps the substrate which is placed on the susceptor 318 at a predetermined temperature.

The cover 317 is provided on the top surface of the treatment container 316 to seal the treatment container 316. The plurality of waveguides 321 included in the cover 317 are juxtaposed and projected in a comb-shape. Each of the waveguides 321 is connected to a microwave power supply 322. A slit 323 is provided in the waveguide 321 so as to leak microwave. Leakage refers to a state in which the slit 323 is clogged with a dielectric plate 324 which transmits a microwave and a microwave is supplied through the dielectric plate 324. The dielectric plate 324 clogs the slit 323 so that a gas for treatment does not flow into the waveguide 321, and is formed of quartz or the like. The dielectric plate 324 is placed in the center of a side wall of the waveguide 321 to generate plasma uniformly. The slit 323 is positioned at side faces of the waveguide 321, that is, the sides of the juxtaposed waveguides which face to another waveguide, and the slits 323 also face each other.

The gas supply means 312 includes the cylinder 313 filled with a gas for treatment (a reactive gas), the valve 314, the mass flow controller 315, and the like. A gas for treatment whose flow rate is adjusted by the mass flow controller 315 is supplied into the treatment container 316. The cylinder 313 is filled with a gas for treatment which is needed for film formation of a microcrystalline semiconductor. The gas for treatment which is needed for film formation includes hydrogen, fluorine, a rare gas such as helium or argon, and a semiconductor material gas such as silane or disilane. The treatment container 316 has a gas supply nozzle 325 and a gas nozzle 326, and the gas for treatment flows into the treatment container 316 from the gas nozzles. For example, any of hydrogen, fluorine, of a rare gas such as helium or argon is supplied to the gas nozzle 325, then, high-density radicals are generated in the vicinity of the dielectric plate 324 to which the microwave is supplied. By the high-density radicals, a surface reaction is promoted on a surface of the substrate to be treated where the microcrystalline semiconductor is to be formed. A semiconductor material gas for depositing a film is supplied to the gas nozzle 326. By separating a gas supply path in such a manner, deposition of a film onto the dielectric plate 324 can be suppressed. During film formation, any of hydrogen, fluorine, or a rare gas such as helium or argon may be continuously supplied from the gas nozzle 325.

A microwave is supplied into the treatment chamber through the dielectric waveguide plate 324. By juxtaposing the waveguides 321 with a narrow gap of 2 mm or more and 10 mm or less therebetween and providing the slits 323 on the surfaces of the waveguides 321, which face to another waveguide, high-density plasma can be generated in a space interposed between the waveguides 321. For example, if a surface wave which propagates on a surface of the dielectric plate 324 is used to form surface wave plasma, high-density uniform plasma can be formed. In this case, plasma is formed in a small space which is interposed between the waveguides 321, that is, in the above-described small gap; therefore, plasma can be stably formed even at a pressure of approximately $1 \times 10^2$ Pa or more and $1 \times 10^5$ Pa or less. The gap between the waveguides is in the range of 2 mm or more and 10 mm or less. The gap can be narrower as the pressure gets higher and the gap can be wider as the pressure gets lower.

The space interposed between the waveguides 321 is provided with plasma generators 327. A plurality of plasma generators 327 are provided along the waveguides 321 in the space interposed between the waveguides 321. The plasma generator 327 is connected to another microwave power supply 328 which is different from the one to which the waveguide 321 is connected. A power amplifier 329 is provided between the microwave power supply 328 and the plasma generator 327. The plasma generator 327 is operated when microwave power is applied to the waveguide 321 to start discharging and is used to trigger plasma.

The plasma generator 327 has a plasma monitor function which examines the state of plasma and an output value therefrom is inputted to the power amplifier 329. As for a method to examine the state of plasma, for example, a Langmuir probe is used and an electron density, an electron temperature, or the like is examined. A measurement value of the plasma which is examined with a plurality of plasma generators 327 which are provided in the treatment chamber is inputted to a control circuit 330. According to the value, an individual control signal for changing amplification factors is outputted to each power amplifier 329 so that the plasma in the treatment chamber has a uniform density. Accordingly, a phenomenon which is called a plasma jumping phenomenon and in which a high density region of plasma moves in a discharge space is effectively suppressed.

The microwave plasma CVD apparatus of this embodiment mode has a plurality of waveguides which are divided and juxtaposed; therefore, uniform plasma can be generated even when a substrate size is increased. Glass substrates for liquid crystal displays, which can be flexibly treated, have variety of sizes, such as 300 mm×400 mm called the first generation, 550 mm×650 mm called the third generation, 730 mm×920 mm called the fourth generation, 1000 mm×1200 mm called the fifth generation, 2450 mm×1850 mm called the sixth generation, 1870 mm×2200 mm called the seventh generation, and 2000 mm×2400 mm called the eighth generation.

Figure 3:
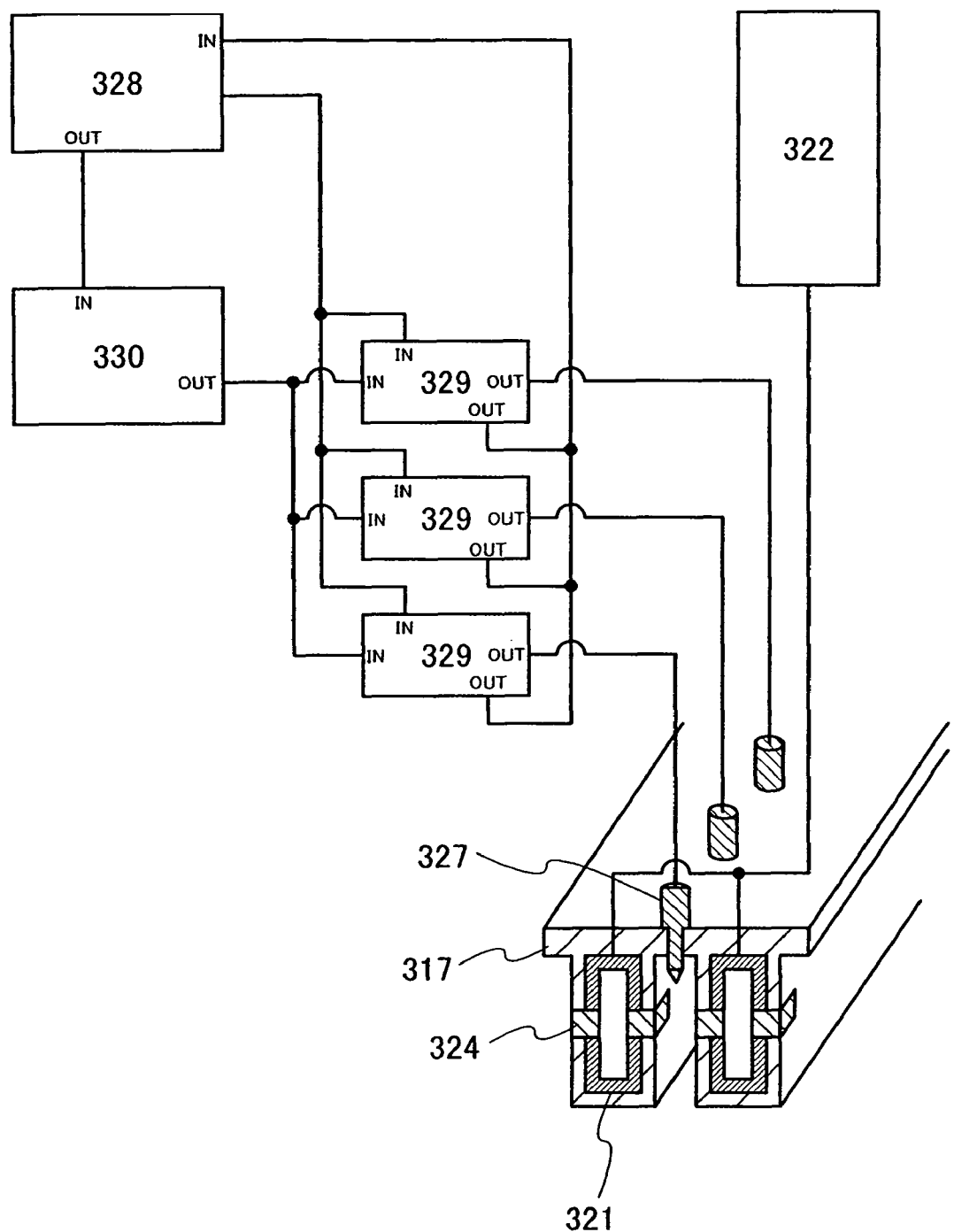
FIG. 3 is a view showing details of a cover portion of a treatment chamber in a multi-chamber microwave plasma CVD apparatus provided with a plurality of treatment chambers.

FIG. 3 is a perspective view showing a structure of the cover 317 and the waveguide 321 in the above-described treatment chamber. Since the waveguides are juxtaposed with the narrow gap of 2 mm or more and 10 mm or less therebetween, narrow groove-shaped spaces which are interposed therebetween are formed. The dielectric plates 324 which clog the slits 323 are provided on sides of the juxtaposed waveguides 321 which face to another waveguide, and microwave is leaked from the slits 323 to generate plasma. The plurality of plasma generators 327 are provided along the narrow groove-shaped spaces which are interposed between the juxtaposed waveguides 321.

Figure 4:
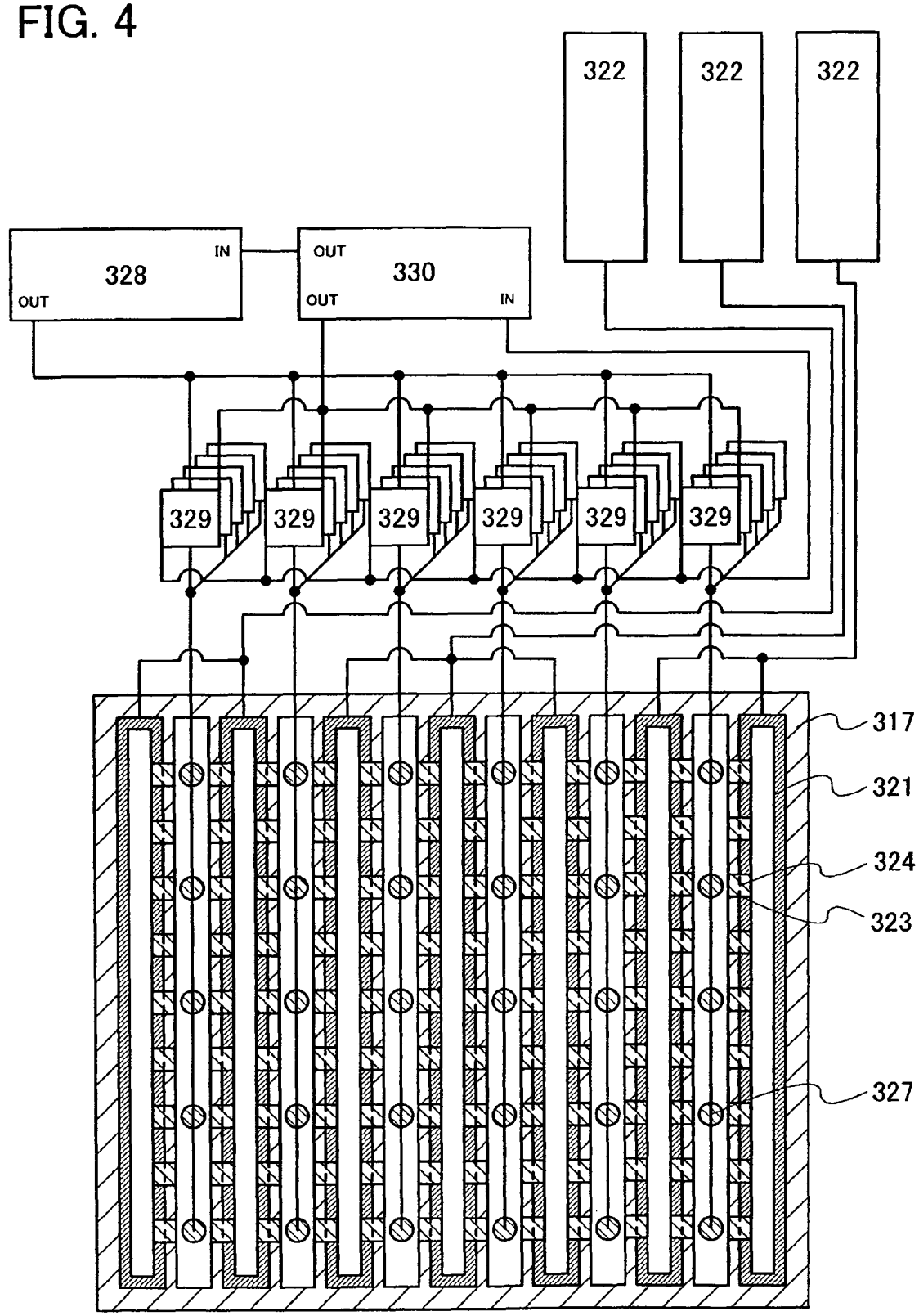
FIG. 4 is a plan view showing a structure of a treatment chamber of a multi-chamber microwave plasma CVD apparatus provided with a plurality of treatment chambers.

FIG. 4 is a plan view showing a structure of the cover 317. The plurality of waveguides 321 are juxtaposed in the cover 317. The waveguide 321 has the slit 323 so that microwave leaks from the slit. The slit 323 is positioned at the sides of the juxtaposed waveguides which face to another waveguide. The slit 323 is clogged with the dielectric plate 324 which transmits microwave so that a gas for treatment does not flow into the waveguide 321. Even when the substrate to be treated has a large area, plasma density can be uniform by juxtaposing the plurality of waveguides 321 and generating microwave discharge in the space interposed between the waveguides 321. Further, the space is provided with the plurality of plasma generators 327 which are provided in a manner such that the gap between the plasma generators 327 is wider than that between the juxtaposed waveguides 321, so that the plasma generators 327 is controlled with the power amplifier 329 and the control circuit 330 to stabilize the plasma and uniform the plasma density. With such a structure, in this apparatus, treatment can be performed on a glass substrate having a size of 730 mm×920 mm or a glass substrate having a side longer than 1 m.

Figure 5:
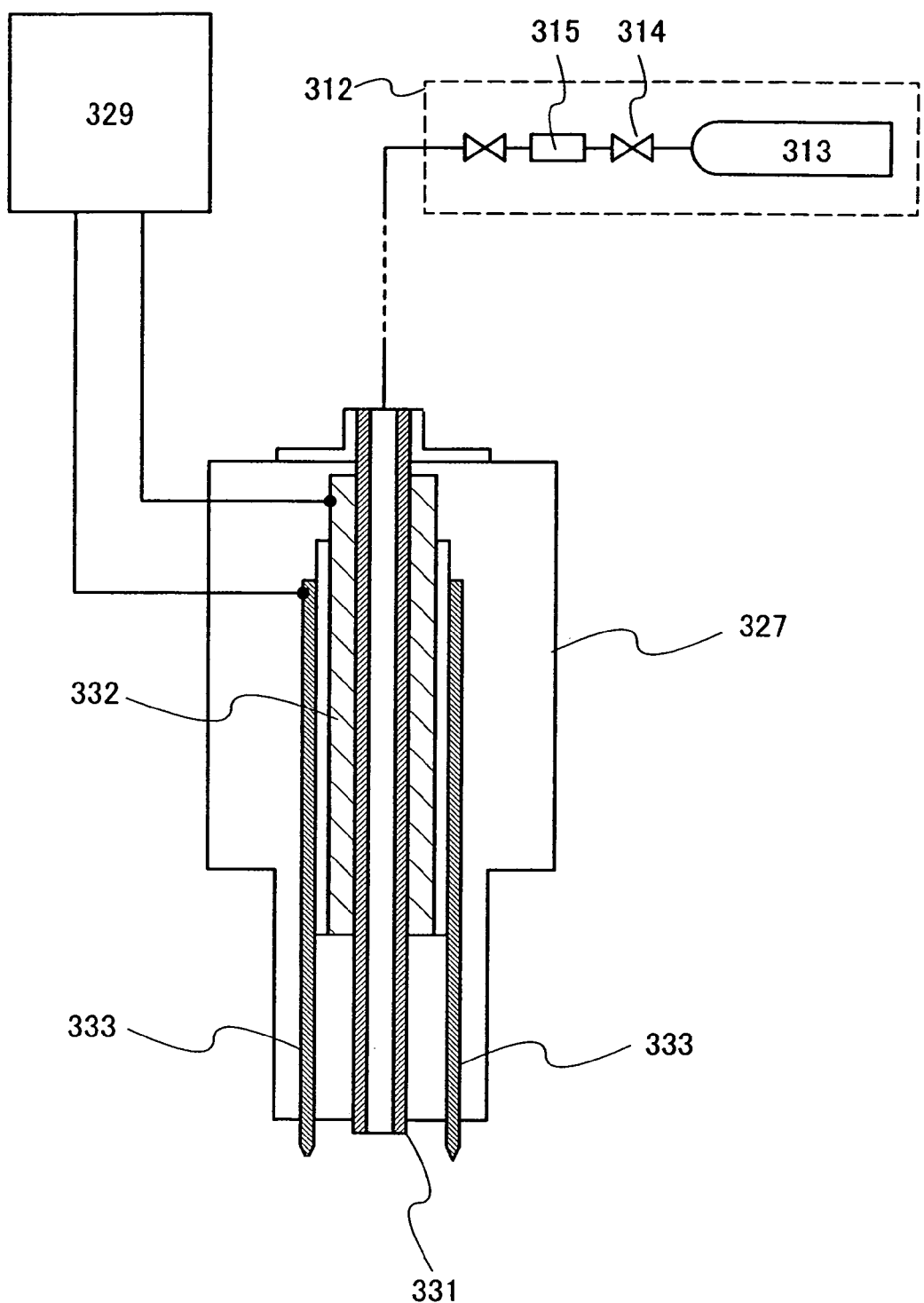
FIG. 5 is a view showing a structure of a plasma generator.

FIG. 5 shows a structure of the plasma generator 327. A gas nozzle 331 is connected to the gas supply means 312. A discharge electrode 332 to which microwave power is supplied is provided on an outer side of the gas nozzle 331. A gas which is not deposited and has low breakdown voltage, such as helium, is supplied to the gas nozzle 331 which is formed of quartz, and power is supplied to the discharge electrode 332 to perform electrodeless discharge. The plasma generated in the gas nozzle 331 is diffused outside the nozzle. By providing the plasma generator 327 in the treatment chamber, the plasma generated here triggers the start of discharge. A probe 333 is prepared for examining plasma, and a Langmuir probe is used, for example. This monitored value is inputted to the control circuit 330 via the power amplifier 329.

Figure 6:
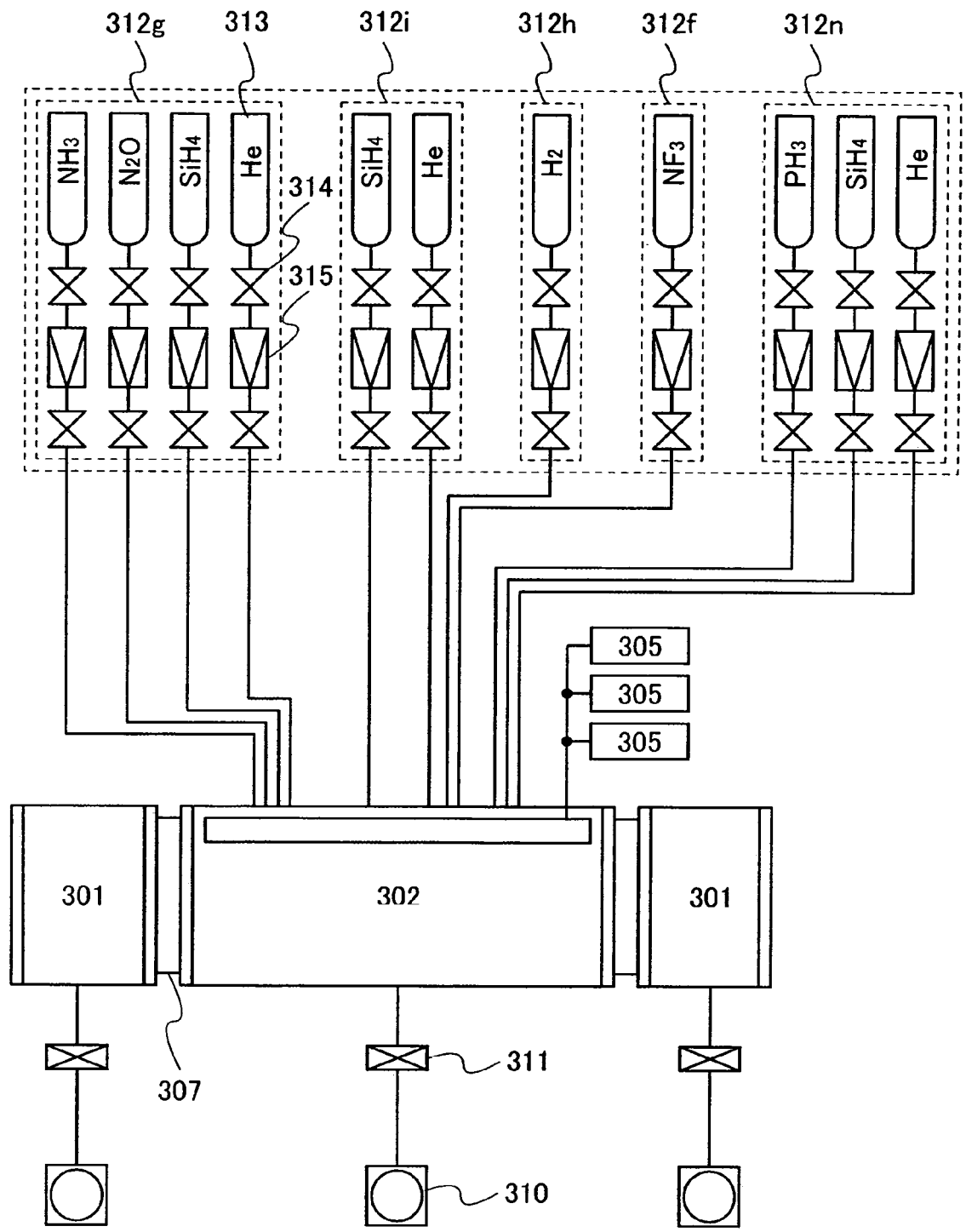
FIG. 6 is a view showing an example of a single-chamber microwave plasma CVD apparatus.

FIG. 6 shows an example of a microwave plasma CVD apparatus in which from a gate insulating layer to a semiconductor layer are successively formed in a single chamber. Other structures of a first treatment chamber 302 and a load/unload chamber 301 are similar to those in FIG. 1.

The air in the first treatment chamber 302 is replaced with an inert gas or a nitrogen gas. A gas supply means 312 and an evacuation means 310 are connected to the first treatment chamber 302 so that a gas for treatment can be made to flow at a pressure of approximately $1 \times 10^2$ Pa or more and $1 \times 10^5$ Pa or less. The gas supply means 312 includes a cylinder 313, a valve 314, a mass flow controller 315, and the like. The cylinder 313 is filled with a semiconductor material gas or a rare gas. A gas supply means 312g is connected to the first treatment chamber 302 and supplies a gas for forming a gate insulating film. A gas supply means 312i is also connected to the first treatment chamber 302 and supplies a gas for an i-type semiconductor layer which forms a channel formation region. A gas supply means 312n is also connected to the first treatment chamber 302 and supplies a gas for an n-type semiconductor layer which forms a source and a drain. A gas supply means 312h supplies hydrogen, and a gas supply means 312f supplies an etching gas which is used for cleaning the inside of the treatment chamber, and these gas supply means are provided as lines shared by the treatment chambers.

The treatment chamber is provided with a plasma generation means 305, and the plasma generation means 305 includes an oscillator which generates plasma in the treatment chamber. For example, the plasma generation means 305 includes a microwave power supply, a microwave amplifier, a waveguide which leads a microwave to the treatment chamber, and the like. The treatment chamber has one or a plurality of the plasma generation means 305. The number of plasma generation means 305 may be determined so that uniformity of a film which is formed over a substrate to be treated is ensured.

In the plasma CVD apparatus having such a structure, a reaction gas is supplied to the treatment chamber where the substrate is placed, and a microwave is supplied to the treatment chamber through a slit provided for the waveguide which is disposed to face the substrate almost parallel. Then, plasma is generated, so that a microcrystalline semiconductor layer can be formed over the substrate. When the gate insulating layer and the microcrystalline semiconductor layer are stacked in one treatment chamber, discharge may be stopped before formation of the microcrystalline semiconductor layer to perform cleaning (flushing) inside the treatment chamber with a $SiH_4$ gas. Residue impurities such as oxygen or $N_2O$ in the treatment chamber can be removed effectively by the flushing.

In the case where a film of a microcrystalline semiconductor is formed using the plasma CVD apparatus having the above-described structure, it is preferable to use helium when plasma is generated in the treatment chamber. In other words, helium is preferably supplied before power for generating plasma is supplied. Helium has an ionization energy of 24.5 eV which is the highest ionization energy among all gases, but helium has a metastable state in a level of approximately 20 eV which is slightly lower than the level of the ionization energy. Therefore, only approximately 4 eV, which is the difference of level between the ionization energy and the metastable state, is needed for ionization during discharge; thus, stable discharge can continuously be kept. In addition, a breakdown voltage of helium is the lowest among all gases. In accordance with such characteristics, helium can hold plasma stably during discharge at an atmospheric pressure or a sub-atmospheric pressure. Further, since uniform plasma can be generated, a uniform film can be deposited even when the area of a substrate over which the microcrystalline semiconductor layer is deposited is increased.

Figure 7:
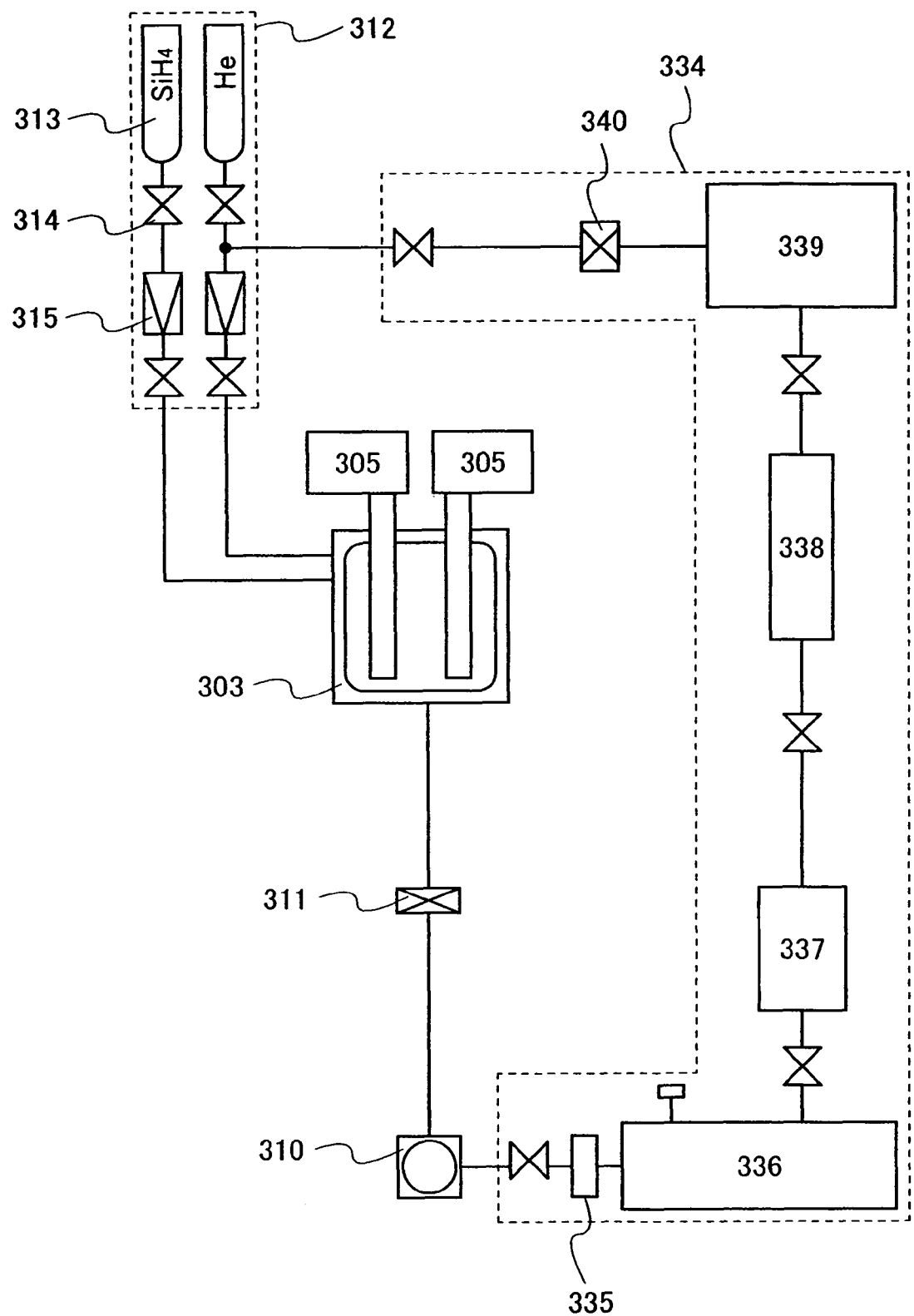
FIG. 7 is a view showing a gas purification circulator in a plasma CVD apparatus.

A microcrystalline semiconductor layer is formed by mixing silane (in the case of a microcrystalline semiconductor having an impurity, a doping gas is used in addition to silane) and hydrogen and/or a rare gas, and using high-density plasma. Silane is diluted 10 to 2000 times with hydrogen and/or a rare gas. The gas which is used for such dilution is also referred to as a dilution gas. Therefore, a large amount of hydrogen and/or the rare gas is needed. Accordingly, a gas which is supplied during film formation of the microcrystalline semiconductor layer may be collected to be reused. FIG. 7 shows an example of a gas purification circulator 334 which is applied to a plasma CVD apparatus.

The gas purification circulator 334 collects and purifies a semiconductor material gas such as silane or a rare gas such as helium. The first treatment chamber 302, the second treatment chamber 303, and the third treatment chamber 304 can be each provided with the gas purification circulator 334. The description of the case in which the gas purification circulator 334 is connected to the first treatment chamber 302 is as follows. A gas for treatment in the first treatment chamber 302 is exhausted as a used gas from the evacuation means 310 which consists of a circulator and the like. The used gas which is exhausted from the evacuation means 310 is stored in a collected gas container 336 after fine particles included in the used gas are removed with a filter 335. After the used gas is stored in the collected gas container 336, the gas is boosted by a booster 337, and only a rare gas such as helium in the gas is separated by a separator 338. As a system of the separator 338, film separation, adsorption separation, absorption separation, cryogenic separation, or the like can be applied. The gas which is separated and purified is stored in a filling container 339. The pressure of the gas stored in the filling container 339 is adjusted to be a predetermined pressure with a pressure controller 340, and then supplied to an upper stream of the mass flow controller 315 of the gas supply means 312. Reusing the gas in such a manner can make it possible to reduce the consumption amount of a gas needed for the microcrystalline semiconductor. In other words, by reusing a rare gas such as helium, the consumption amount of the total energy for manufacturing a display device can be reduced, and emission of carbon dioxide can be reduced.

According to the microwave plasma CVD apparatus of this embodiment mode, a microcrystalline semiconductor layer can uniformly be deposited over a large-sized substrate. Hereinafter, the outline of a manufacturing process of a display device will be described.

[Embodiment Mode 1]

A manufacturing process of a display device including a TFT having a channel formed of a microcrystalline semiconductor layer will be described with reference to the drawings. FIGS. 8, 9, 10, and 11 are each a plan view of a pixel, and cross-sectional views taken along line A-B in FIGS. 8, 9, 10, and 11 are shown in FIGS. 12, 13, 14, 15, and 16, respectively. The following description is made with reference to these plan views and cross-sectional views as appropriate.

(1) Formation of Gate Electrode and Capacitor Electrode

Figure 8:
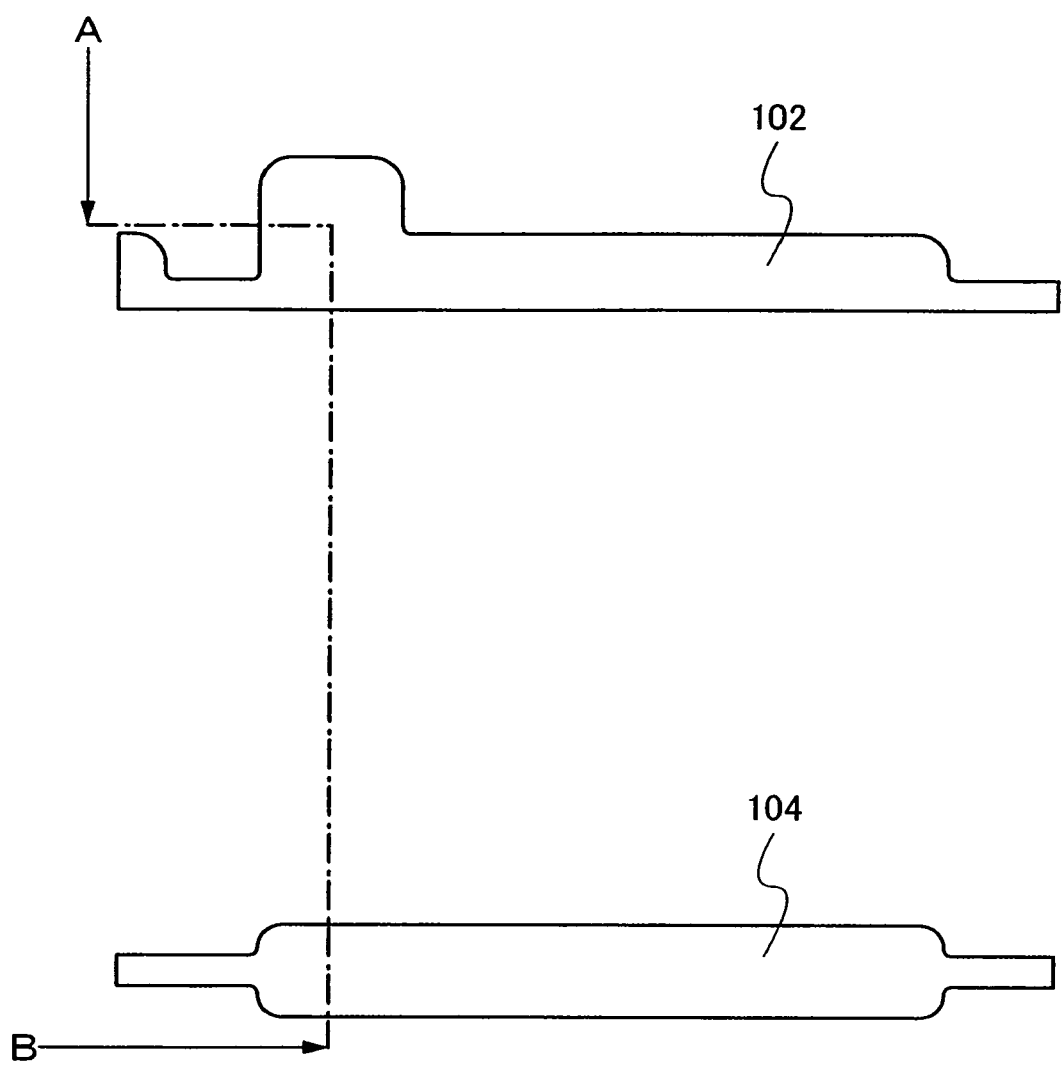
FIG. 8 is a plan view showing a manufacturing step of a display device including a TFT having a channel formed of a microcrystalline semiconductor layer in Embodiment Mode 1.
Figure 9:
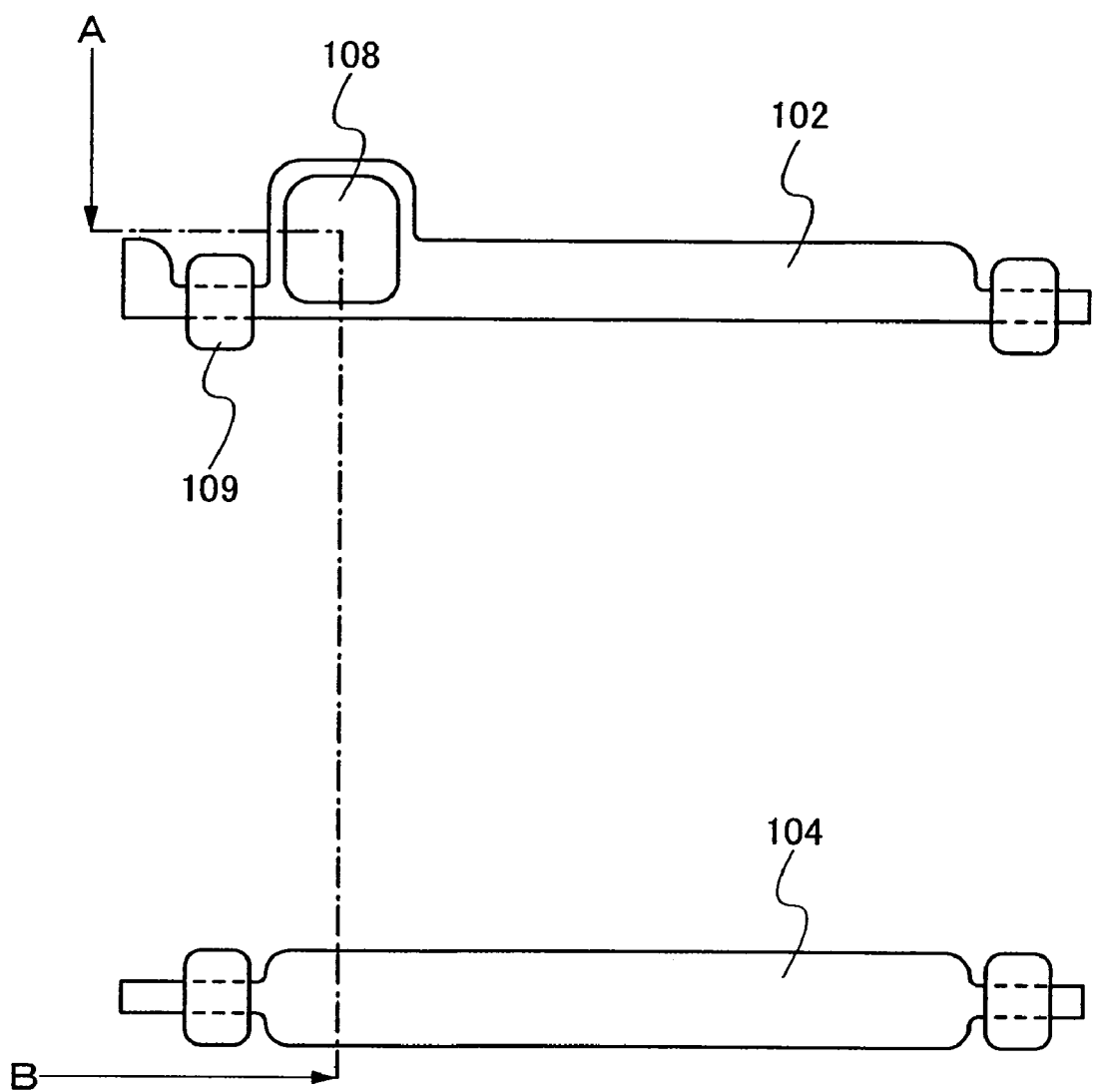
FIG. 9 is a plan view showing a manufacturing step of a display device including a TFT having a channel formed of a microcrystalline semiconductor layer in Embodiment Mode 1.
Figure 12:
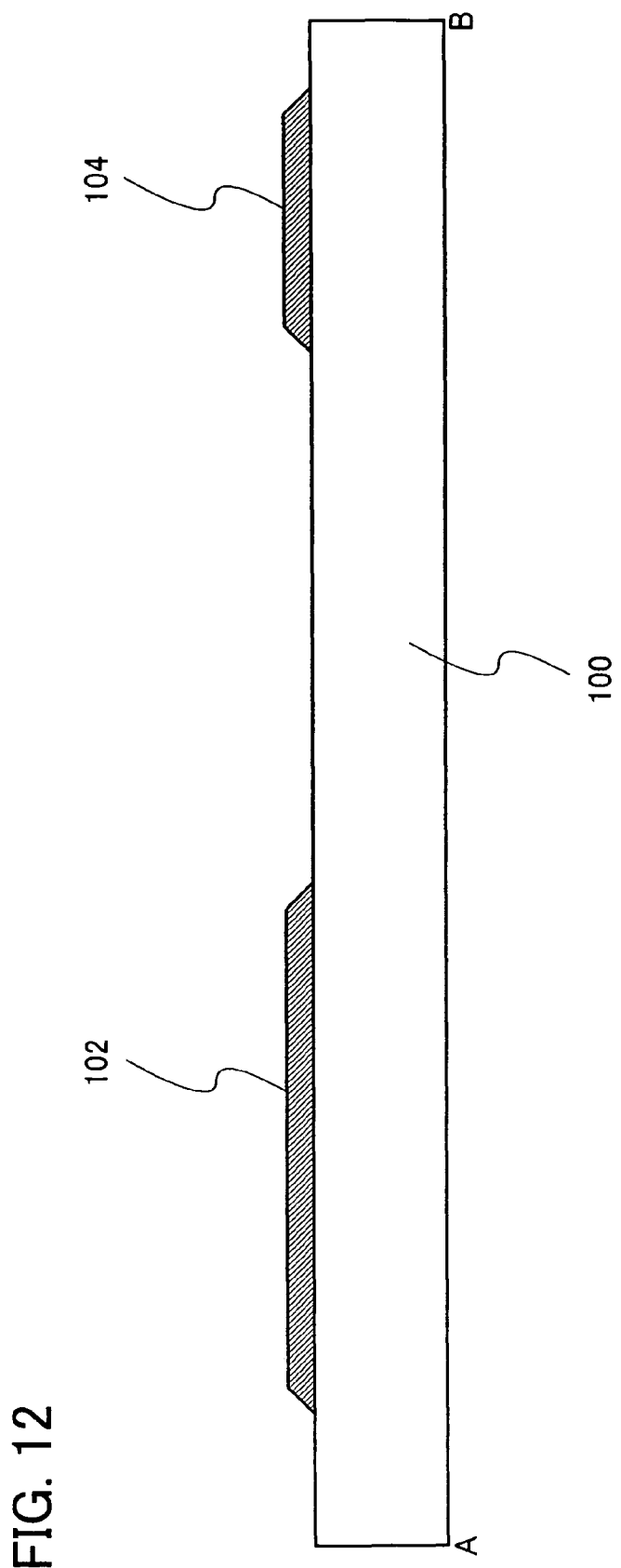
FIG. 12 is a cross-sectional view showing a manufacturing step of a display device including a TFT having a channel formed of a microcrystalline semiconductor layer in Embodiment Mode 1.

As an element substrate 100 where a TFT is manufactured, a flat substrate having an insulating surface such as a glass substrate is applied. A gate electrode layer 102 and a capacitor electrode layer 104 are formed over the element substrate 100 (FIGS. 8 and 12).

The gate electrode layer 102 and the capacitor electrode layer 104 are formed of a metal material. As a metal material, aluminum, chromium, titanium, tantalum, molybdenum, copper, or the like is applied. As a preferable example, the gate electrode layer 102 and the capacitor electrode layer 104 are formed of aluminum or in a staked-layer structure of aluminum and a barrier metal. As a barrier metal, a refractory metal such as titanium, molybdenum, or chromium is applied. A barrier metal is preferably provided for preventing hillocks and oxidation of aluminum.

Figure 13:
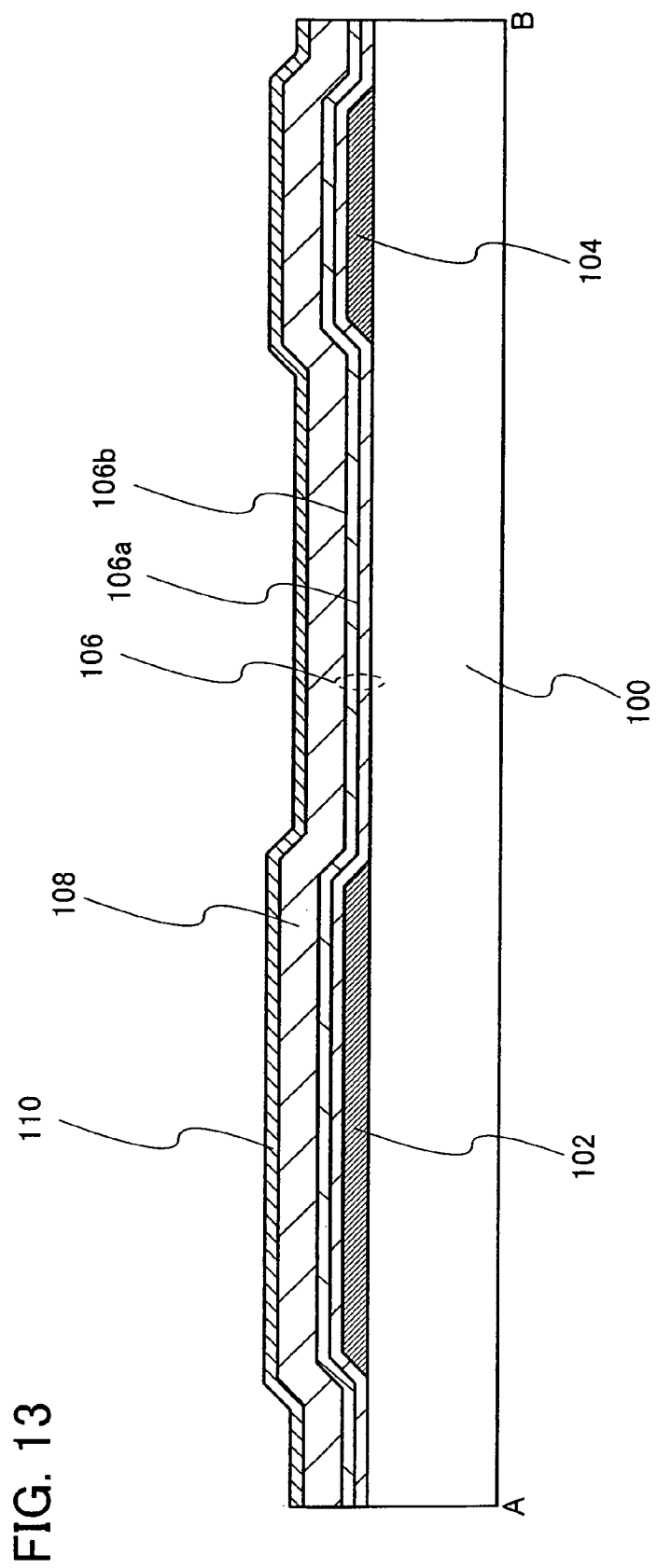
FIG. 13 is a cross-sectional view showing a manufacturing step of a display device including a TFT having a channel formed of a microcrystalline semiconductor layer in Embodiment Mode 1.
Figure 14:
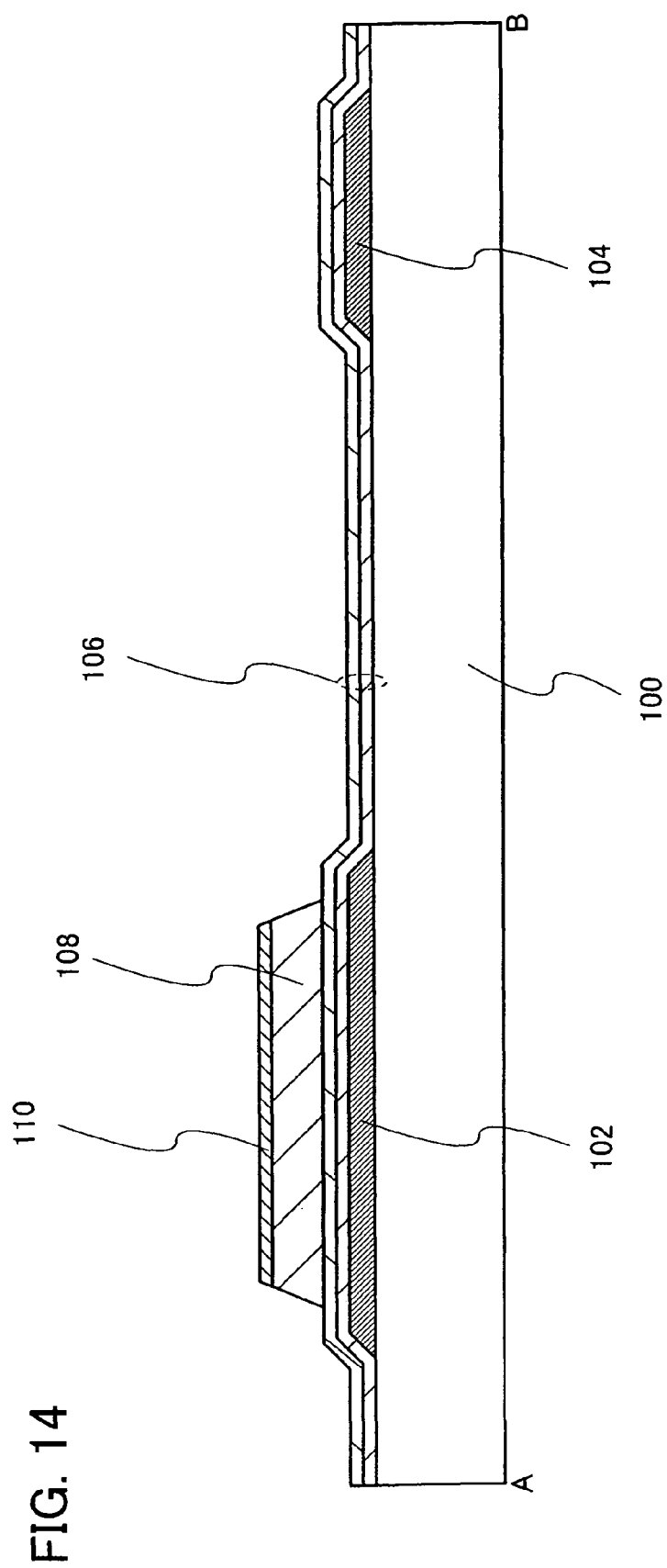
FIG. 14 is a cross-sectional view showing a manufacturing step of a display device including a TFT having a channel formed of a microcrystalline semiconductor layer in Embodiment Mode 1.

(2) Formation of Gate Insulating Layer, Microcrystalline Semiconductor Layer, and Impurity Semiconductor Layer After the gate electrode layer 102 and the capacitor electrode layer 104 are formed, a gate insulating layer 106, a microcrystalline semiconductor layer 108, and an impurity semiconductor layer 110 are formed over the element substrate 100 (FIG. 13). With the use of the plasma CVD apparatus described in FIGS. 1 to 7, these layers can be successively stacked without exposure of the interface of each layer to the atmosphere.

The gate insulating layer 106 is formed of an insulating material such as silicon nitride, silicon oxide, silicon nitride oxide, silicon oxynitride, aluminum nitride, or aluminum nitride oxide. First, the element substrate 100 over which the gate electrode layer 102 and the capacitor electrode layer 104 are formed is carried to a treatment chamber having a structure as shown in FIG. 1. Then, a reactive gas containing helium is supplied to the treatment chamber. While the pressure in the treatment chamber is kept at an atmospheric pressure or a sub-atmospheric pressure, the gate insulating layer 106 is formed by plasma which is generated by supplying microwave power at an atmospheric pressure or a sub-atmospheric pressure. Note that the inner side of the treatment chamber may be coated with a film of the same kind or a similar kind of the gate insulating layer 106, such as a silicon nitride film or a silicon oxide film. Accordingly, the proportion of degassing from the inner wall of the treatment chamber is reduced; thus, contamination caused by a metal impurity or the like can be prevented.

As the gate insulating layer 106 thus formed, for example, a silicon nitride layer (or a silicon nitride oxide layer) is provided over the gate electrode layer 102 and the capacitor electrode layer 104 as a first gate insulating layer 106a, and a silicon oxide layer (or a silicon oxynitride layer) is provided thereover as a second gate insulating layer 106b. The gate insulating layer 106 is formed of a plurality of layers in this manner, so that a plurality of functions can be provided to the gate insulating layer 106. In other words, a silicon nitride layer (or a silicon nitride oxide layer) is provided as the first gate insulating layer 106a, so that prevention of impurity diffusion from the element substrate 100 and oxidation of the gate electrode layer 102 and the like can be achieved. Further, when aluminum is used for the gate electrode layer 102, hillocks of aluminum can be prevented. A silicon oxide layer (or a silicon oxynitride layer) is provided as the second gate insulating layer 106b, so that adhesion to a semiconductor layer is increased and the effect of stress strain of the first gate insulating layer 106a is relieved. The first gate insulating layer 106a is preferably formed with a film thickness of 10 to 100 nm, and the second gate insulating layer 106b is preferably formed with a film thickness of 50 to 150 nm.

Note that a silicon oxynitride film means a film which contains more oxygen than nitrogen and includes oxygen, nitrogen, silicon, and hydrogen (and/or an OH group) at concentrations ranging from, for example, 55 to 65 atomic %, 1 to 20 atomic %, 25 to 35 atomic %, and 0.1 to 10 atomic %, respectively. Further, a silicon nitride oxide film means a film which contains more nitrogen than oxygen and includes oxygen, nitrogen, silicon, and hydrogen (and/or an OH group) at concentrations ranging from, for example, 15 to 30 atomic %, 20 to 35 atomic %, 25 to 35 atomic %, and 15 to 25 atomic %, respectively.

The microcrystalline semiconductor layer 108 is formed over the gate insulating layer 106 of the element substrate 100 which is placed in the treatment chamber. At this time, a reactive gas containing helium is supplied to the treatment chamber. While the pressure in the treatment chamber is kept at an atmospheric pressure or a sub-atmospheric pressure, a microwave is supplied in a space which is interposed between the juxtaposed waveguides to generate plasma. A reactive gas includes hydrogen, and a silicon hydride gas or a silicon halide gas.

The microcrystalline semiconductor layer 108 is formed by exciting silane which is a silicon hydride gas included in a reactive gas into a plasma state by an electromagnetic energy of a microwave (typically, 2.45 GHz) to deposit a reaction product. A typical silicon hydride gas is $SiH_4$ or $Si_2H_6$. Alternatively, $SiH_2Cl_2$, $SiHCl_3$, $SiCl_4$, $SiF_4$, or the like can be used as a silicon halide gas or a silicon halide hydride gas. A heating temperature of the substrate may be 100 to 400° C. (preferably 200 to 350° C.). The film thickness of the microcrystalline semiconductor layer 108 may be 50 to 500 nm (preferably 100 to 250 nm). Note that the inner side of the treatment chamber may be coated with a film of the same kind or a similar kind of the microcrystalline semiconductor layer 108. When the microcrystalline semiconductor layer 108 is formed of silicon, the inner side of the treatment chamber is coated with a silicon film or the like. Accordingly, the proportion of the generation of degassing from the inner wall of the treatment chamber is reduced; thus, contamination caused by an impurity such as metal or the like can be prevented. Further, it is preferable to perform treatment which improves a clean level by making a semiconductor material gas of the microcrystalline semiconductor layer, for example, a $SiH_4$ gas flow before generating plasma so as to react with residual oxygen, moisture, or the like in the treatment chamber.

A microcrystal can be formed easily by using the silicon hydride gas and the like which are diluted with a dilution gas. As a dilution gas, any one of hydrogen, a rare gas (e.g., helium, argon, krypton, or neon), or a halogen gas (e.g. fluorine or chlorine), or a combination thereof can be used. Further, a plurality of helium, argon, krypton, or neon which is a rare gas can be combined. The semiconductor material gas is preferably diluted with a dilution ratio of 10 to 2000 times. A pressure at which plasma is generated may be an atmospheric pressure or a sub-atmospheric pressure (a pressure of $1\times10^2$ Pa or more and $1\times10^5$ Pa or less). When plasma is generated at such a pressure, the radical reaction proceeds in the vapor phase, and the deposition rate is improved with the reaction on a surface of the microcrystalline semiconductor layer. Microcrystal nuclei are generated by the radical reaction in the vapor phase, so that an initial microcrystalline layer can be deposited from a surface to be formed which is on the gate insulating layer 106. In other words, formation of an amorphous layer at initial deposition of the microcrystalline semiconductor layer 108 can be prevented as much as possible. A microwave is discharged with pulse of 1 to 100 kHz during film formation, so that the radical reaction in the vapor phase is controlled, and thus the abnormal growth in the vapor phase, such as generation of particles, can be suppressed, which is preferable. The microcrystalline semiconductor layer thus formed can achieve a deposition rate which is approximately 50 times as high as a deposition rate of a conventional microcrystalline semiconductor layer.

In order to generate plasma, 1 GHz to 5 GHz, typically, 2.45 GHz of an electromagnetic wave may be supplied. The substrate heating temperature is preferably less than or equal to 500° C., and the substrate heating temperature of 100 to 400° C. is recommended. Further, hydride of carbon such as $CH_4$ or $C_2H_6$, germanium hydride or germanium fluoride such as $GeH_4$ or $GeF_4$, may be mixed into the semiconductor material gas, and the energy band width may be adjusted to be 1.5 to 2.4 eV or 0.9 to 1.1 eV. When carbon or germanium is added to silicon which forms a microcrystalline semiconductor layer, temperature characteristics of a TFT can be changed.

A one conductivity-type impurity for the purpose of control of valence electrons is added to the impurity semiconductor layer (semiconductor layer having an impurity) 110.

When the impurity semiconductor layer 110 has n-type conductivity, phosphorus or arsenic is added, and when the impurity semiconductor layer 110 has p-type conductivity, boron is added. The impurity semiconductor layer 110 is formed of an amorphous semiconductor or a microcrystalline semiconductor.

(3) Processing of Semiconductor Layer

The microcrystalline semiconductor layer 108 and the impurity semiconductor layer 110 formed over the element substrate 100 are processed into a predetermined pattern by etching. The microcrystalline semiconductor layer 108 and the impurity semiconductor layer 110 are processed by etching so as to be overlapped at least with part or with the entire part of the gate electrode layer 102 in a pixel region of the display device (see FIGS. 9 and 14). With such a structure, a channel portion of a TFT can be shielded from light and is not affected by light, so that the gate voltage can act uniformly on the microcrystalline semiconductor layer 108. The edge portions of the microcrystalline semiconductor layer 108 and the impurity semiconductor layer 110 are processed into tapered shapes, so that there are advantageous effects to improve step coverage of a wiring layer which is formed thereover and to reduce leakage currents which flow through the edge portions of the microcrystalline semiconductor layer 108 and the impurity semiconductor layer 110. Note that a semiconductor layer 109 is provided to overlap with the gate electrode layer 102 and the capacitor electrode layer 104 in a position corresponding to the intersection portion of the gate electrode layer 102 and the capacitor electrode layer 104 with the wiring layer which will be formed in a subsequent step. Accordingly, step coverage of the wiring layer in the intersection portion can be improved (see FIG. 9). The semiconductor layer 109 can be formed in the same manner as the microcrystalline semiconductor layer 108.

(4) Formation of Wiring Layer and Protective Layer

Figure 10:
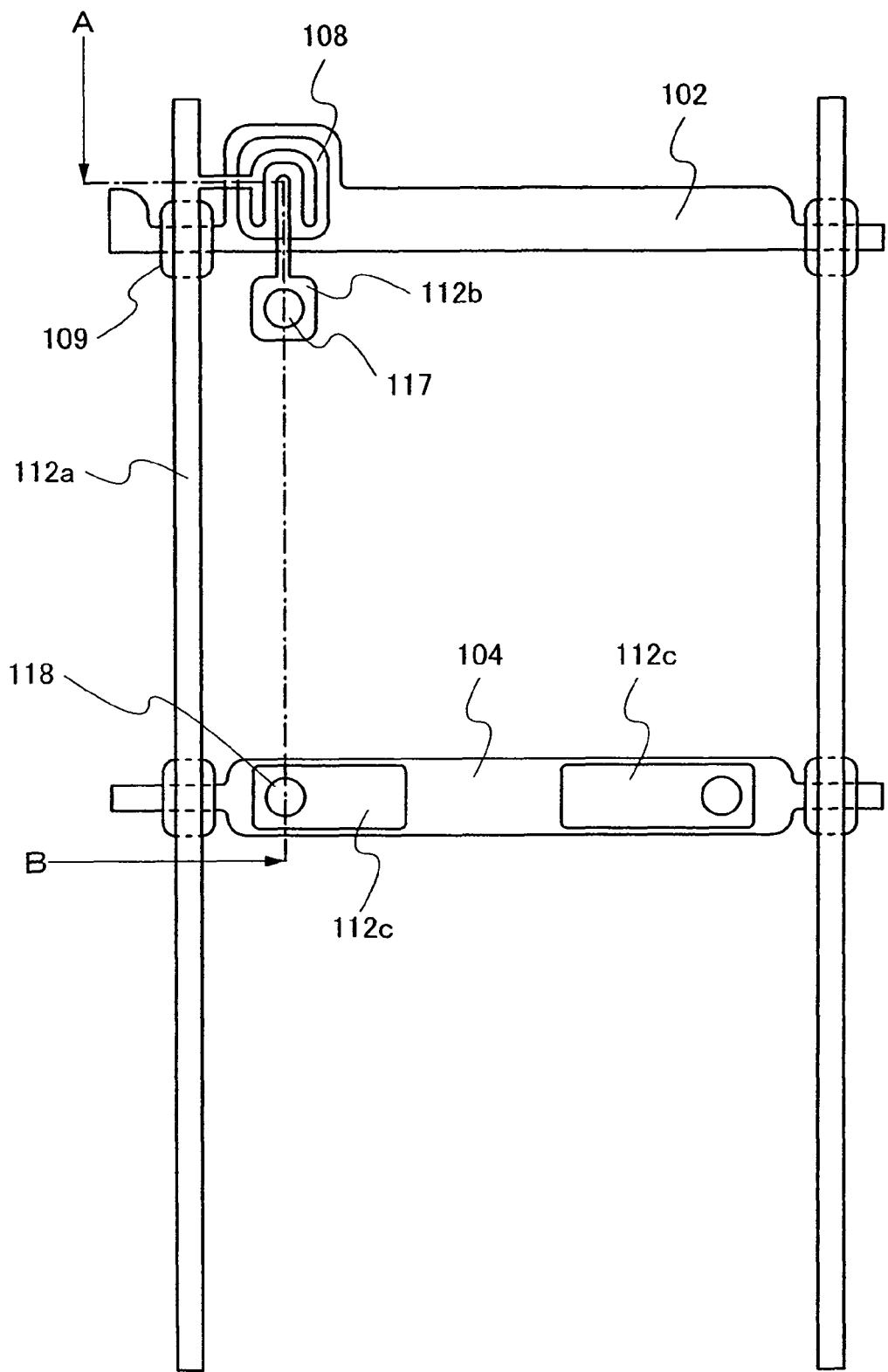
FIG. 10 is a plan view showing a manufacturing step of a display device including a TFT having a channel formed of a microcrystalline semiconductor layer in Embodiment Mode 1.
Figure 15:
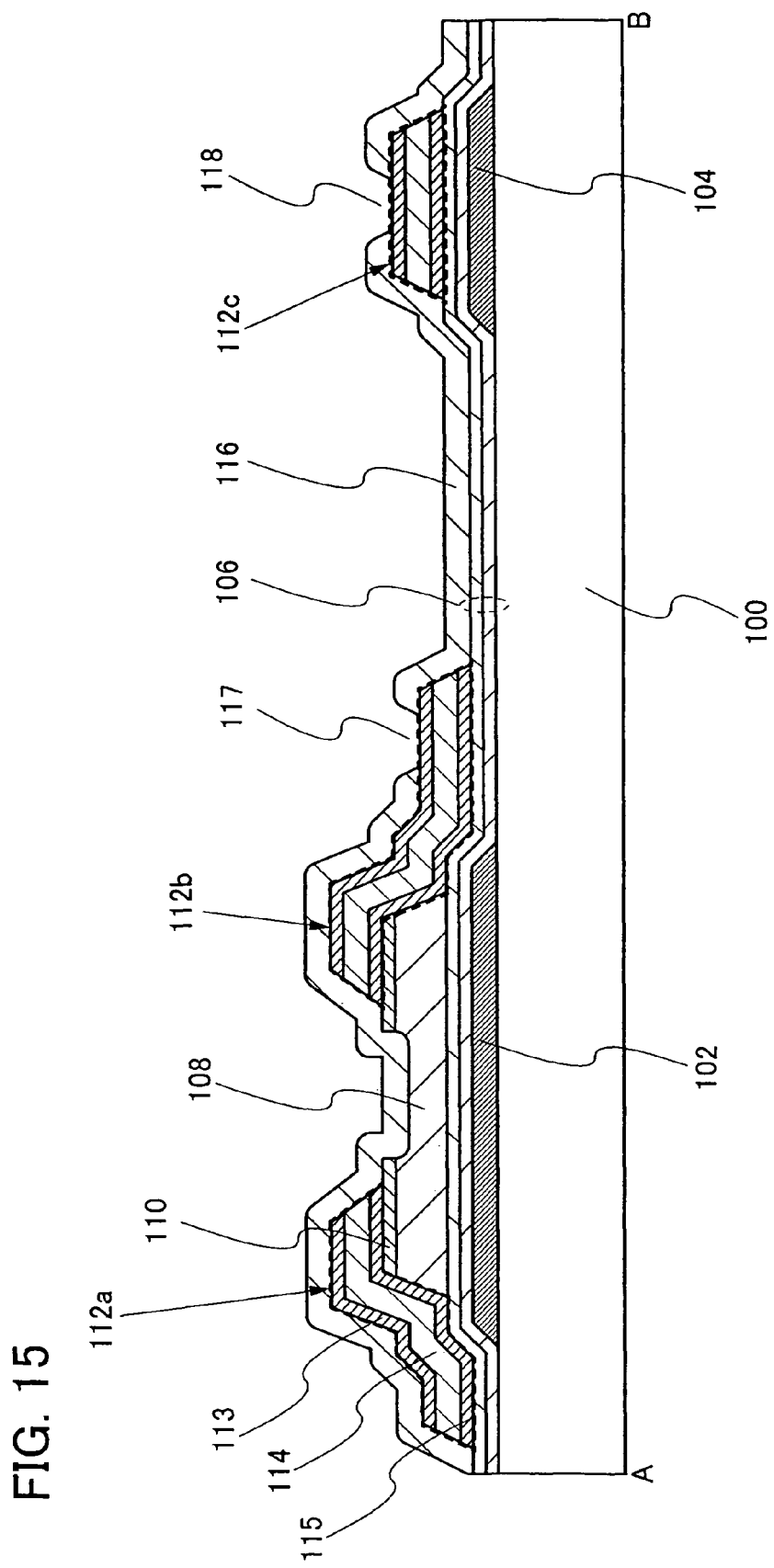
FIG. 15 is a cross-sectional view showing a manufacturing step of a display device including a TFT having a channel formed of a microcrystalline semiconductor layer in Embodiment Mode 1.

The wiring layer and a protective insulating layer 116 which are extended in a direction intersected with the gate electrode layer 102 are formed (see FIGS. 10 and 15). The wiring layer includes a wiring layer 112a which is imparted with potential on a source or drain side of a TFT, a wiring layer 112b which is connected to a pixel electrode and imparted with potential on a drain or source side of the TFT, and a capacitor electrode layer 112c.

The wiring layer 112a, the wiring layer 112b, and the capacitor electrode layer 112c are preferably formed of aluminum, copper, or aluminum to which an element which improves resistance to heat or an element which prevents hillocks (e.g., silicon, titanium, neodymium, or scandium) is added. A layer of aluminum or the like is formed by a sputtering method or an evaporation method, a predetermined resist mask is formed by photolithography, and etching is performed to form those layers. As etching, dry etching or wet etching can be performed. The impurity semiconductor layer 110 is etched by utilizing the resist mask which is formed here. Part of the microcrystalline semiconductor layer 108 may be etched by the etching. The wiring layer 112a and the wiring layer 112b are in contact with the impurity semiconductor layer 110 and are isolated over the microcrystalline semiconductor layer 108. A channel formation region of the TFT is formed by removal of the impurity semiconductor layer 110 between the wiring layer 112a and the wiring layer 112b by etching.

Alternatively, the wiring layer 112a, the wiring layer 112b, and the capacitor electrode layer 112c may be formed using a conductive nanopaste of silver, copper, or the like by a screen printing method, an ink-jet method, or a nano-imprinting method.

The wiring layer 112a, the wiring layer 112b, and the capacitor electrode layer 112c may be formed of the above-described aluminum, copper, or the like. Alternatively, a stacked-layer structure may be employed in which a conductive material which functions as a barrier layer for improving adhesion with a base and preventing diffusion is combined with the above-described aluminum, copper, or the like. For example, a first conductive layer 113 can be formed of a refractory metal such as molybdenum, chromium, titanium, tantalum, or titanium nitride, a second conductive layer 114 can be formed of the above-described aluminum or the like, and a third conductive layer 115 can be formed of a refractory metal similar to a refractory metal of the first conductive layer 113, and the first and third conductive layers function as barrier layers.

The protective insulating layer 116 is formed so as to cover the microcrystalline semiconductor layer 108, the wiring layer 112a, the wiring layer 112b, the capacitor electrode layer 112c, and the like. The protective insulating layer 116 is preferably formed of silicon nitride or silicon nitride oxide. In the protective insulating layer 116, a contact hole 117 which opens the wiring layer 112b and a contact hole 118 which opens the capacitor electrode layer 112c are formed.

(5) Formation of Pixel Electrode

Figure 11:
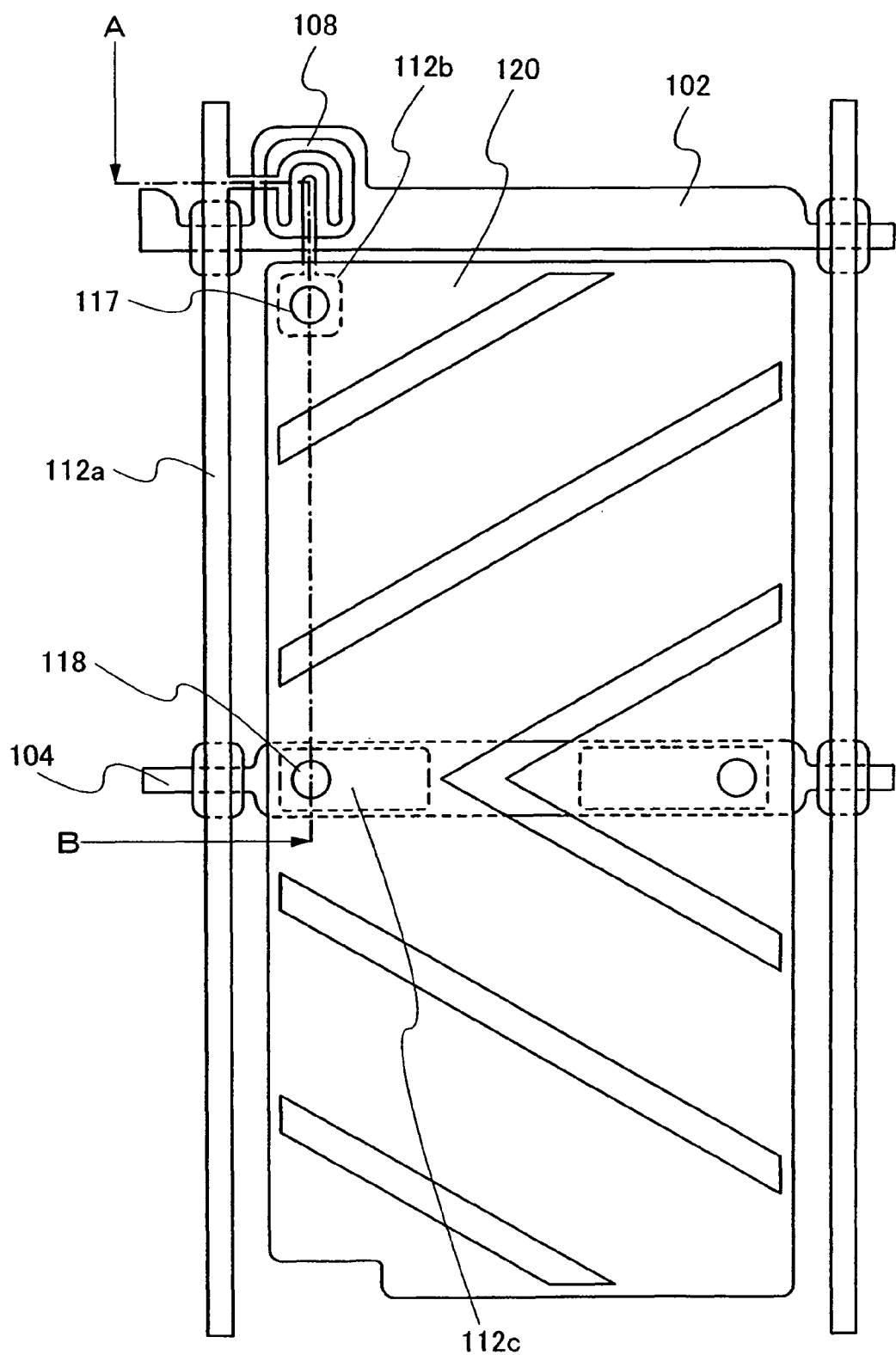
FIG. 11 is a plan view showing a manufacturing step of a display device including a TFT having a channel formed of a microcrystalline semiconductor layer in Embodiment Mode 1.
Figure 16:
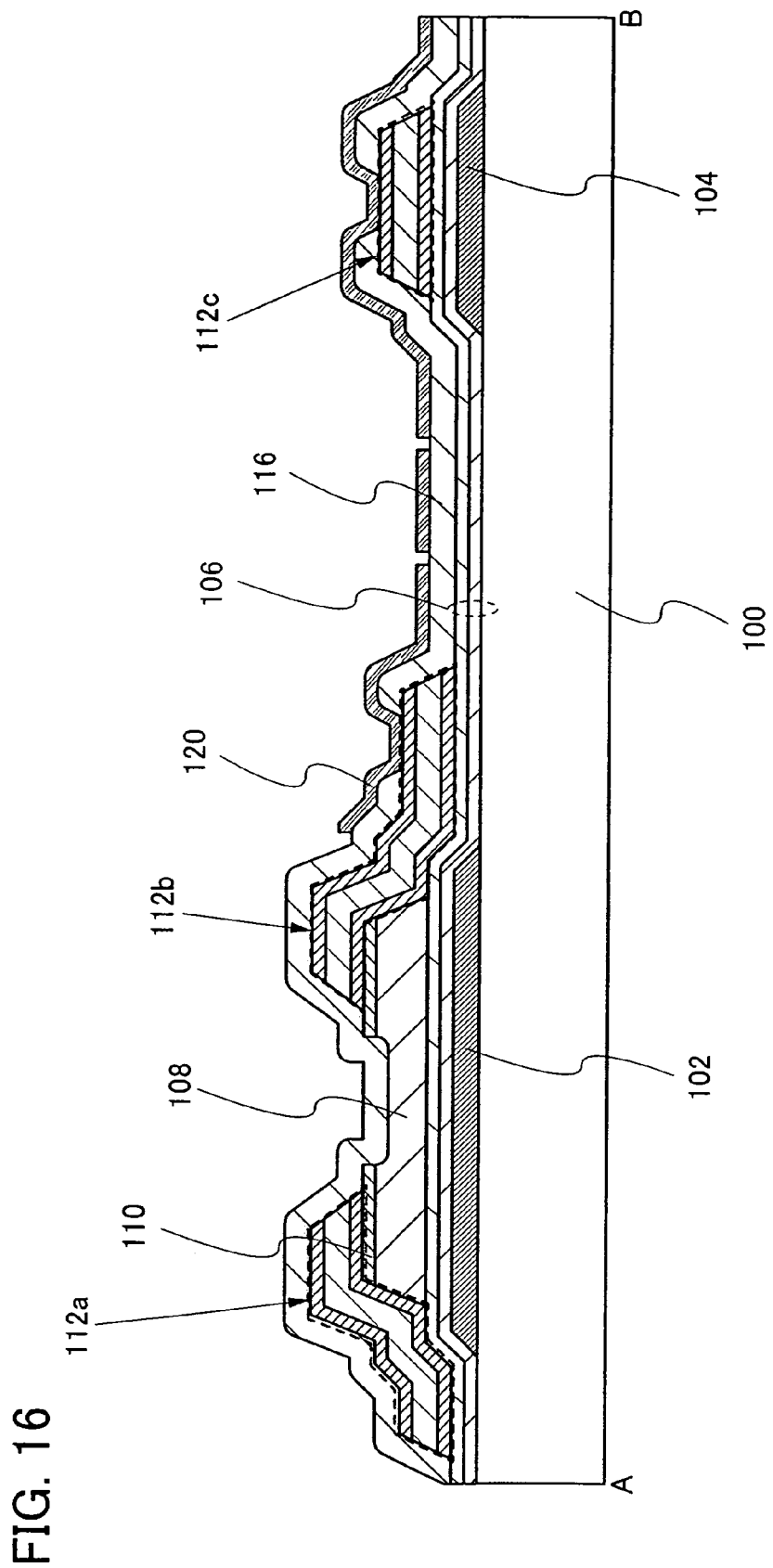
FIG. 16 is a cross-sectional view showing a manufacturing step of a display device including a TFT having a channel formed of a microcrystalline semiconductor layer in Embodiment Mode 1.

A pixel electrode 120 is formed over the protective insulating layer 116 (FIGS. 11 and 16). The pixel electrode 120 is connected to the wiring layer 112b through the contact hole 117 and the capacitor electrode layer 112c through the contact hole 118. The pixel electrode 120 is formed of a transparent electrode material such as indium tin oxide, zinc oxide, or tin oxide. Alternatively, an organic conductive material may be used.

The pixel electrode 120 is provided with a slit so that orientation of liquid crystals can be controlled. Such a structure is applied to a VA (vertical alignment)-mode liquid crystal. The VA-mode liquid crystal is a kind of mode for controlling alignment of liquid crystal molecules of a liquid crystal panel. The VA-mode liquid crystal is a mode in which liquid crystal molecules are aligned in a vertical direction to a panel surface when no voltage is applied. A liquid crystal display device can be completed by attaching a counter substrate to the element substrate 100 and providing a liquid crystal layer between the two substrates.

In this manner, the TFT, the pixel electrode 120 connected thereto, and a storage capacitor portion are formed over the element substrate 100. According to this embodiment mode, since a channel of the TFT is formed of a microcrystalline semiconductor, variation of a threshold voltage of the TFT is suppressed and operational stability of the display device can be secured. Formation of the microcrystalline semiconductor layer can be performed by a plasma CVD method and does not need a step of laser crystallization unlike formation of a polysilicon semiconductor layer; thus, productivity is not impaired.

[Embodiment Mode 2]

Figure 17:
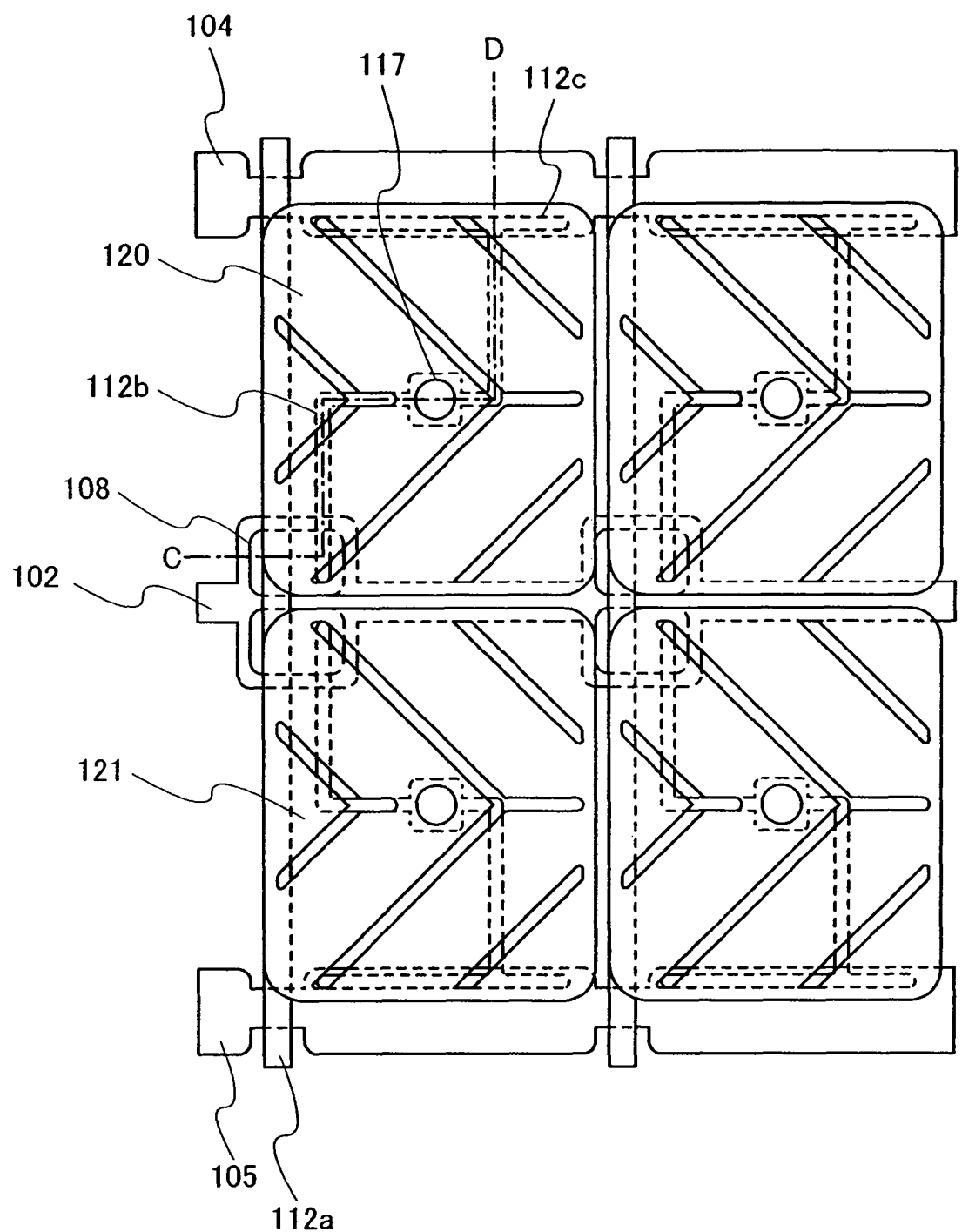
FIG. 17 is a plan view showing an example of a display device including a TFT having a channel formed of a microcrystalline semiconductor layer in Embodiment Mode 2.
Figure 18:
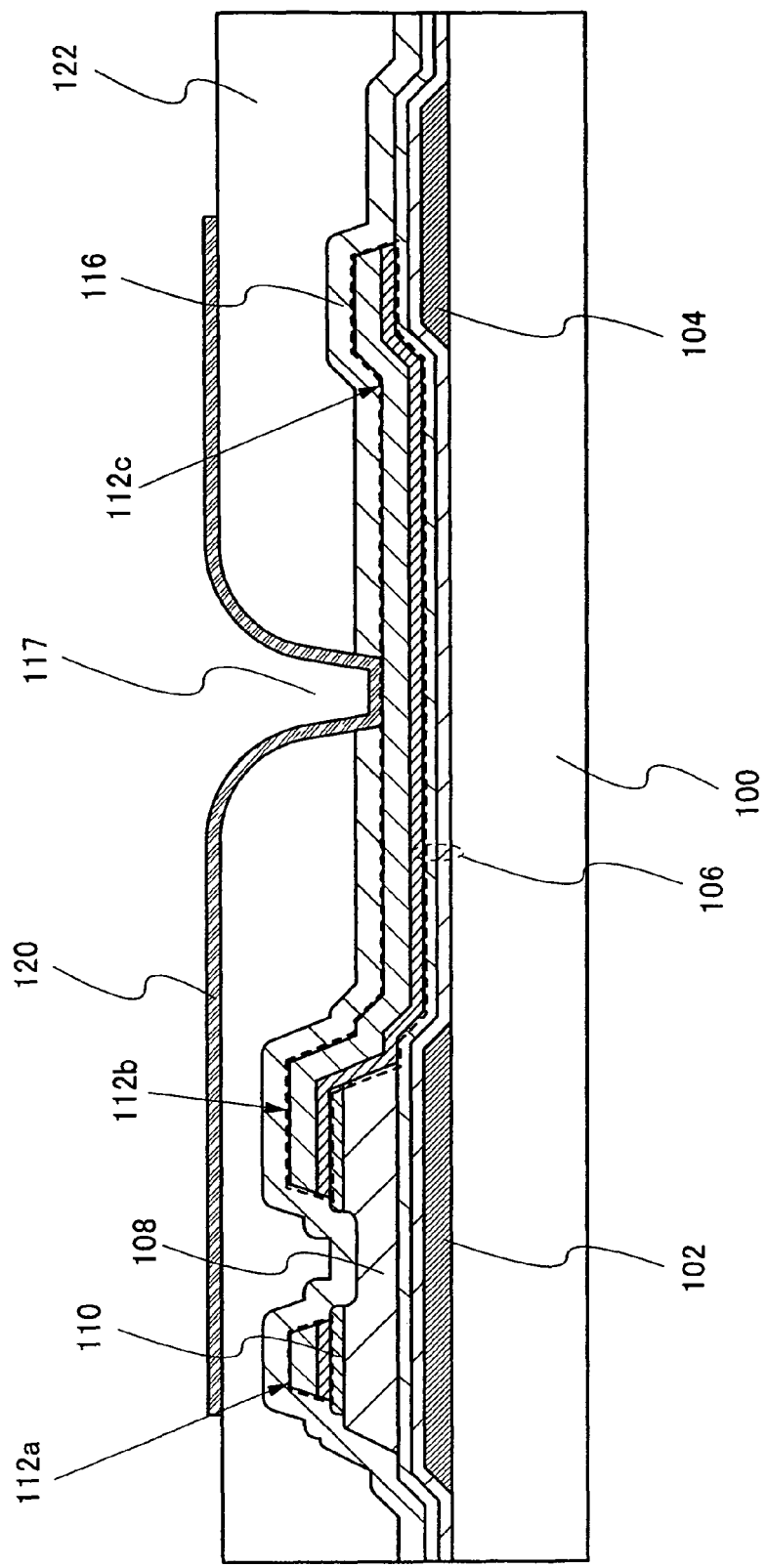
FIG. 18 is a cross-sectional view showing an example of a display device including a TFT having a channel formed of a microcrystalline semiconductor layer in Embodiment Mode 2.

This embodiment mode will exemplify pixels of a liquid crystal panel of a VA (vertical alignment)-mode liquid crystal, which has a so-called multi-domain design where a pixel is divided into some regions (sub-pixels). FIG. 17 shows a plan view of the pixel, and FIG. 18 shows a cross-sectional view taken along line C-D in FIG. 17.

The structure of an element substrate 100, a gate electrode layer 102, a capacitor electrode layer 104, a gate insulating layer 106, a microcrystalline semiconductor layer 108, an impurity semiconductor layer 110, wiring layers 112a and 112b, and a capacitor electrode layer 112c is the same as the structure in Embodiment Mode 1. An interlayer insulating layer 122 is formed over a protective insulating layer 116, and further a contact hole 117 which penetrates the interlayer insulating layer 122 and the protective insulating layer 116 is formed. The interlayer insulating layer 122 is formed of an inorganic insulating material such as silicon oxide or an organic insulating material typified by polyimide or acrylic.

A pixel electrode 120 is provided over the interlayer insulating layer 122. The pixel electrode 120 is provided with a slit for controlling orientation of liquid crystals. A pixel electrode 121 adjacent to the pixel electrode 120 is connected to another TFT where a gate potential is applied at the same timing as a TFT connected to the pixel electrode 120. In this embodiment mode, one pixel includes the pixel electrode 120 and the pixel electrode 121. In other words, the pixel electrode 120 and the pixel electrode 121 each form a sub-pixel of a pixel. In this case, the potential of the capacitor electrode layer 104 is made different from that of a capacitor electrode layer 105, so that the potential of the pixel electrode 120 can be made different from that of the pixel electrode 121. In other words, the potentials of the capacitor electrode layers 104 and 105 are individually controlled, so that orientation of liquid crystals is precisely controlled and a viewing angle can be increased.

Figure 19:
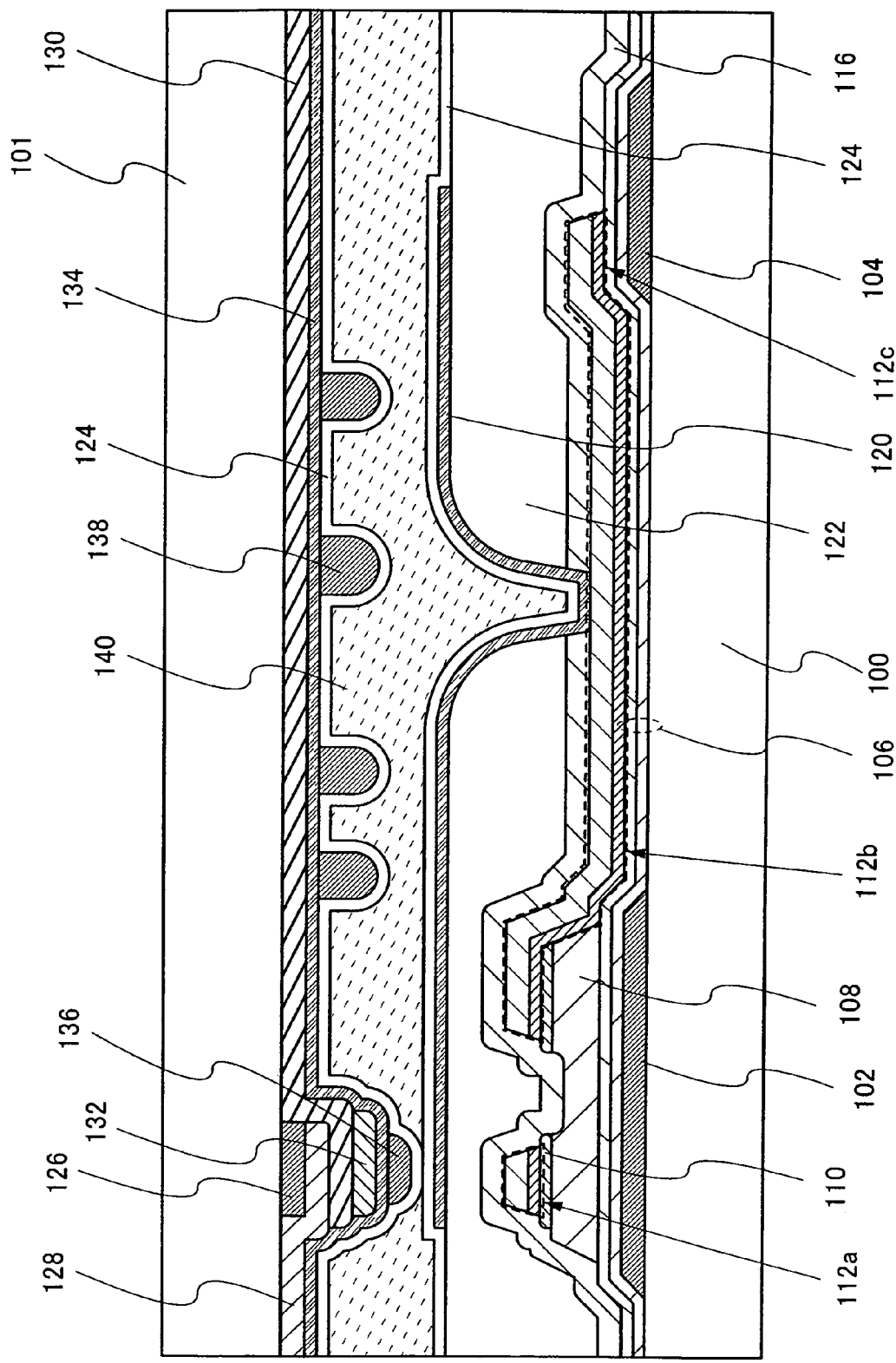
FIG. 19 is a cross-sectional view showing an example of a display device including a TFT having a channel formed of a microcrystalline semiconductor layer in Embodiment Mode 2.
Figure 20:
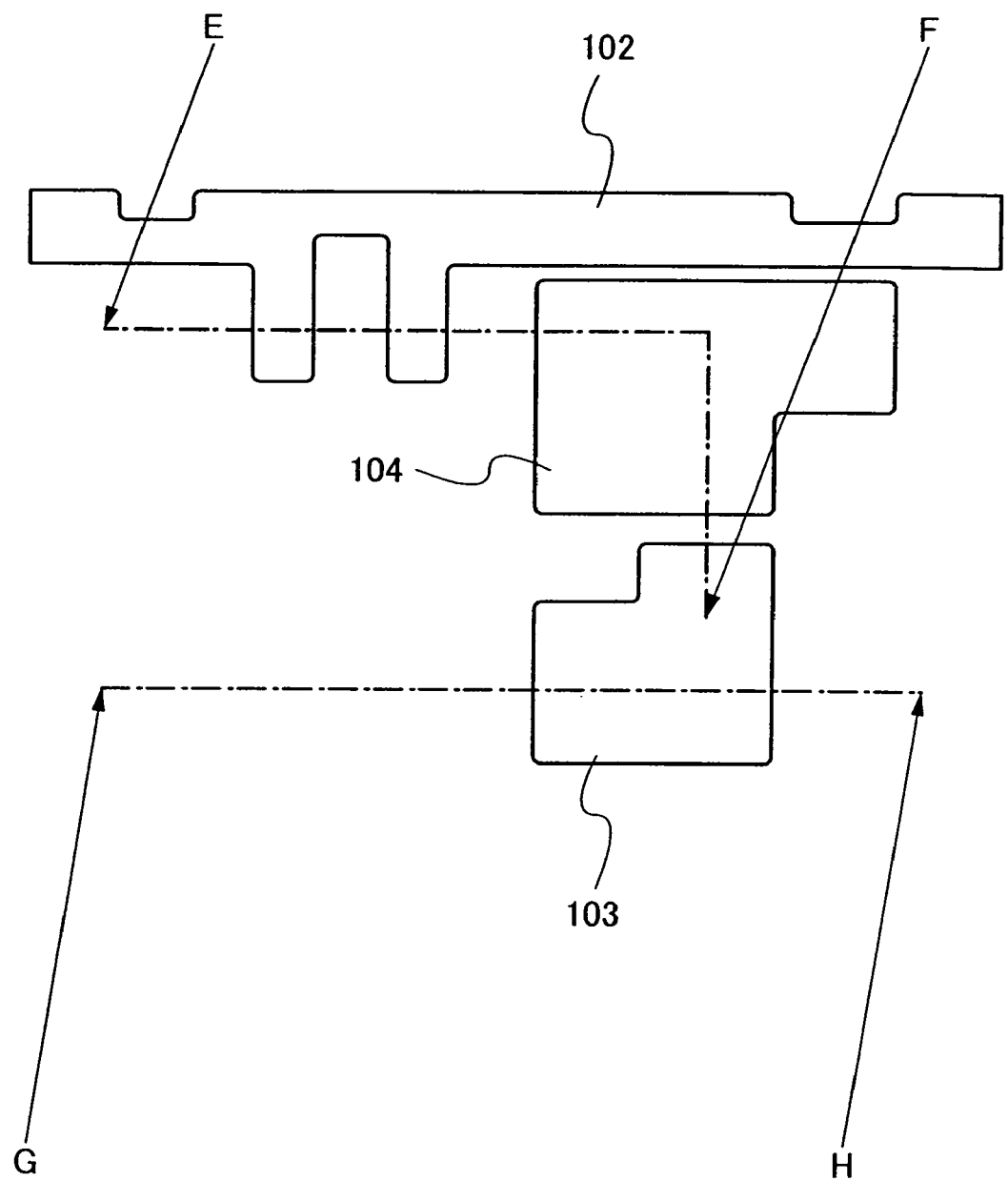
FIG. 20 is a plan view showing a manufacturing step of a display device including a TFT having a channel formed of a microcrystalline semiconductor layer in Embodiment Mode 3.
Figure 21:
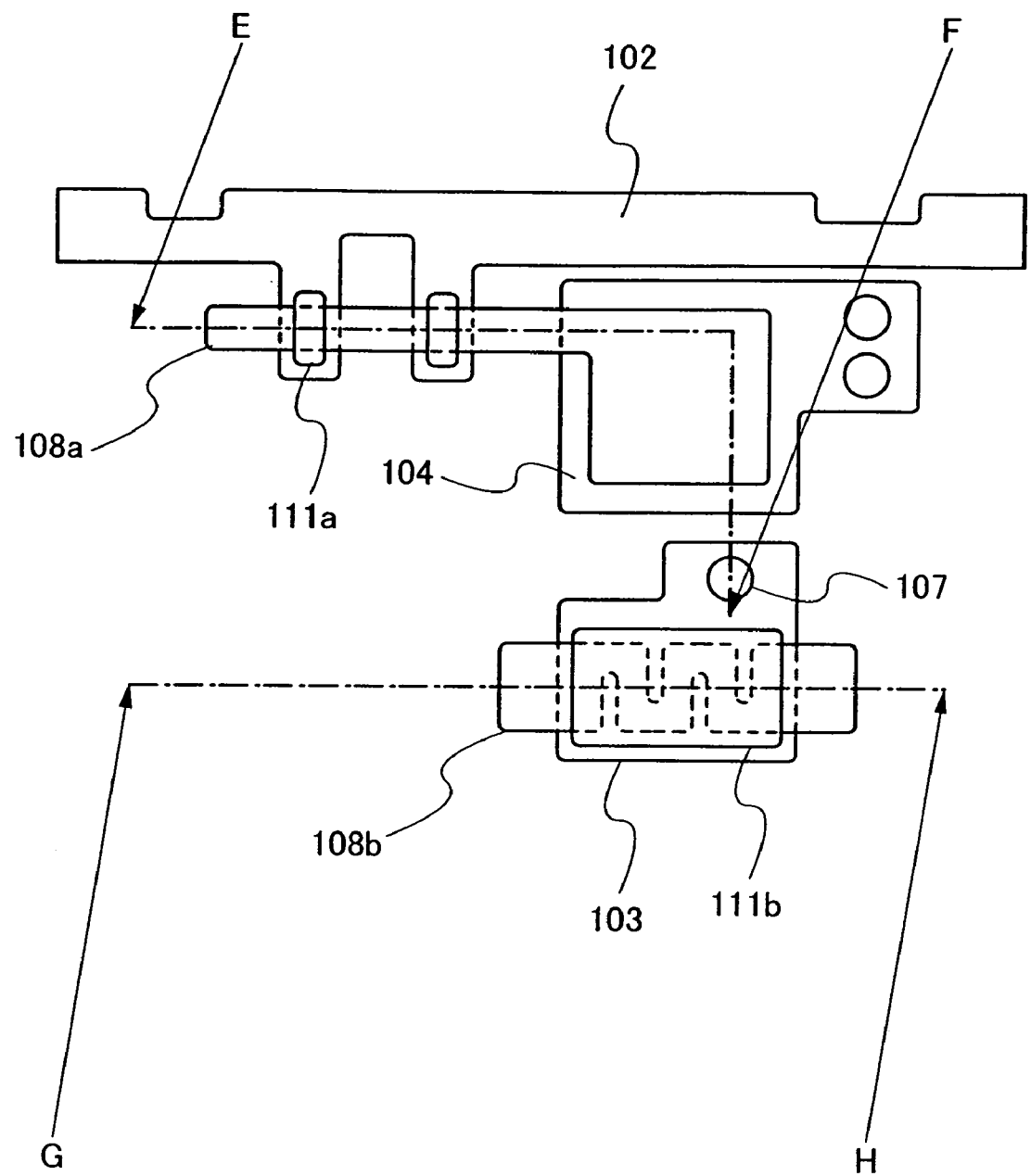
FIG. 21 is a plan view showing a manufacturing step of a display device including a TFT having a channel formed of a microcrystalline semiconductor layer in Embodiment Mode 3.

FIG. 19 shows a state where the substrate 100 is stacked with a counter substrate 101 and liquid crystals are injected therebetween. In a position of the counter substrate 101 where a spacer 136 is formed, a light-shielding layer 126, a first colored layer 128, a second colored layer 130, a third colored layer 132, and a counter electrode 134 are formed. With this structure, the height of a projected rib 138 to control orientation of liquid crystals is made different from that of the spacer 136. Each of the pixel electrode 120 and the counter electrode 134 is provided with an orientation film 124. A liquid crystal layer 140 is formed between the orientation films 124.

According to this embodiment mode, since a channel of the TFT is formed of a microcrystalline semiconductor, variation of a threshold voltage of the TFT is suppressed and operational stability of the multi-domain liquid crystal display device can be secured. Formation of the microcrystalline semiconductor layer can be performed by a plasma CVD method and does not need a step of laser crystallization unlike a polysilicon semiconductor layer; thus, productivity is not impaired.

[Embodiment Mode 3]

A manufacturing process of a display device including a TFT having a channel formed of a microcrystalline semiconductor layer will be described with reference to the drawings. In this embodiment mode, a display device having a structure in which a pixel is provided with a light-emitting element is shown. FIGS. 20 to 23 each show a plan view of a pixel, and FIGS. 24A and 24B, FIGS. 25A and 25B, FIGS. 26A and 26B, FIGS. 27A and 27B, FIGS. 28A and 28B, FIGS. 29A and 29B, and FIGS. 30A and 30B each show a cross-sectional view. In FIGS. 24A and 24B, FIGS. 25A and 25B, FIGS. 26A and 26B, FIGS. 27A and 27B, FIGS. 28A and 28B, FIGS. 29A and 29B, and FIGS. 30A and 30B, cross-sectional views taken along line E-F in the plan views are shown in FIG. 24A, FIG. 25A, FIG. 26A, FIG. 27A, FIG. 28A, FIG. 29A, and FIG. 30A, and cross-sectional views taken along line G-H in the plan views are shown in FIG. 24B, FIG. 25B, FIG. 26B, FIG. 27B, FIG. 28B, FIG. 29B, and FIG. 30B. The following description is made with reference to these plan views and cross-sectional views as appropriate.

(1) Formation of Gate Electrode and Capacitor Electrode

A flat substrate having an insulating surface such as a glass substrate is employed as an element substrate 100 over which a TFT is formed. Over the element substrate 100, a gate electrode layer 102, a gate electrode layer 103, and a capacitor electrode layer 104 are formed (see FIG. 20 and FIGS. 24A and 24B).

(2) Formation of Gate Insulating Layer and Microcrystalline Semiconductor Layer

Figure 25A:
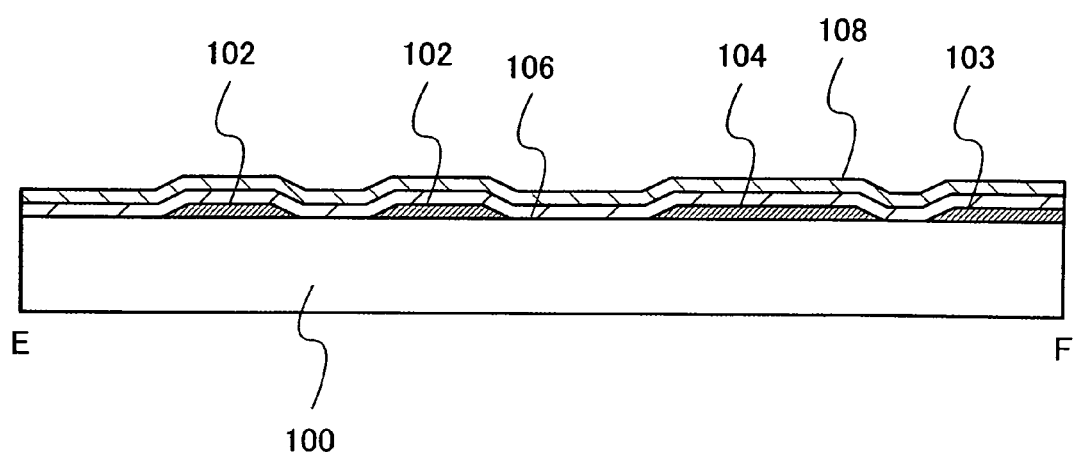
FIGS. 25A and 25B are cross-sectional views showing a manufacturing step of a display device including a TFT having a channel formed of a microcrystalline semiconductor layer in Embodiment Mode 3.
Figure 25B:
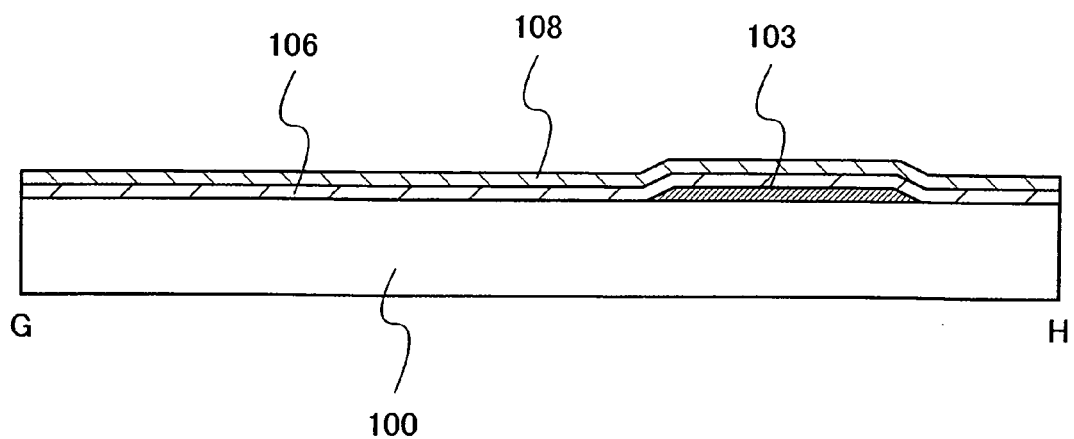
Figure 26A:
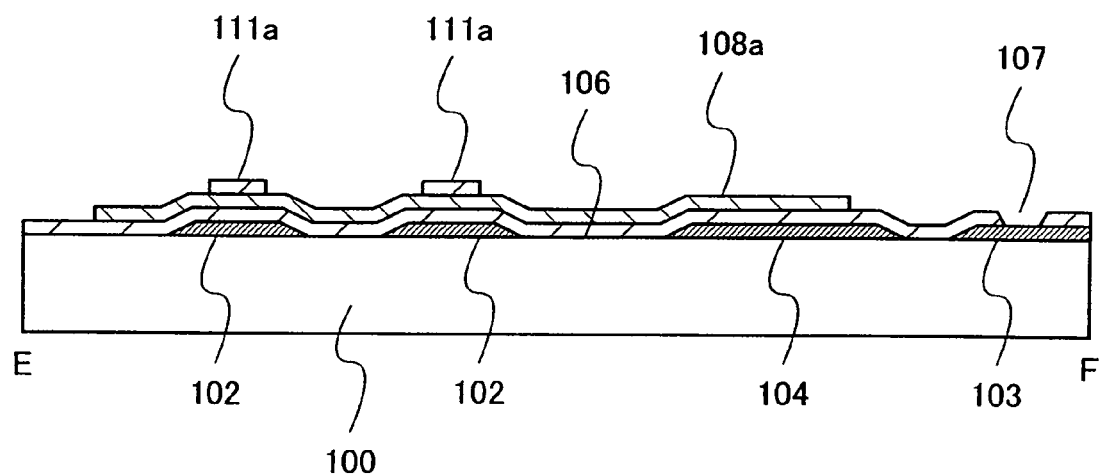
FIGS. 26A and 26B are cross-sectional views showing a manufacturing step of a display device including a TFT having a channel formed of a microcrystalline semiconductor layer in Embodiment Mode 3.
Figure 26B:
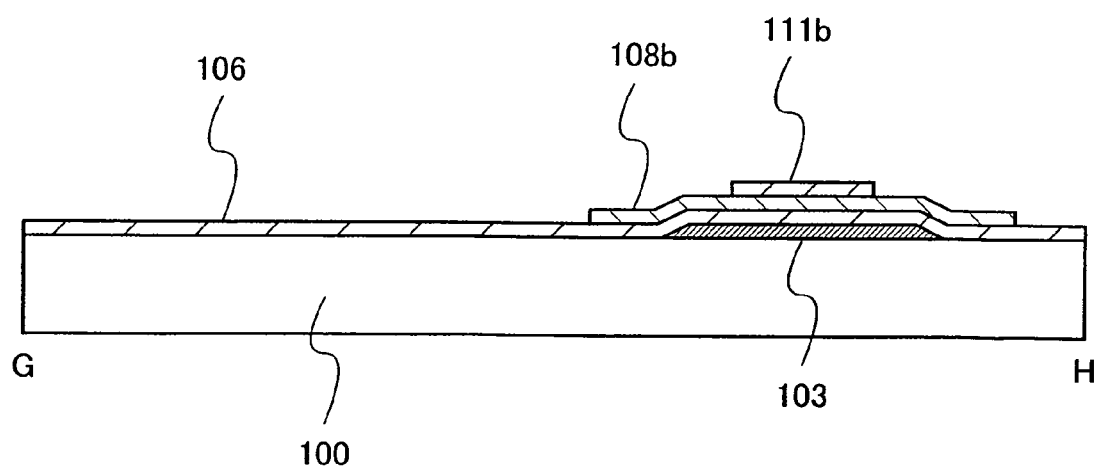

After the gate electrode layer 102, the gate electrode layer 103, and the capacitor electrode layer 104 are formed, a gate insulating layer 106 and a microcrystalline semiconductor layer 108 are formed over the element substrate 100 (see FIGS. 25A and 25B). With the use of the plasma CVD apparatus described in FIGS. 1 to 7, these layers can be successively stacked without exposure of the interface of each layer to the atmosphere. A film formation method is similar to that in Embodiment Mode 1.

(3) Processing of Semiconductor Layer

The microcrystalline semiconductor layer 108 formed over the element substrate 100 is processed into a predetermined pattern by etching. After that, channel protective insulating layers 111a and a channel protective insulating layer 111b are formed (see FIG. 21 and FIGS. 26A and 26B). The channel protective insulating layers 111a are each formed so that a microcrystalline semiconductor layer 108a overlaps with the gate electrode layer 102, and the channel protective insulating layer 111b is formed so that a microcrystalline semiconductor layer 108b overlaps with the gate electrode layer 103. The channel protective insulating layers 111a and 111b are preferably formed of silicon nitride in order to prevent oxidation of the microcrystalline semiconductor layers 108a and 108b. A contact hole 107 which exposes the gate electrode layer 103 which is provided therebelow is formed in the gate insulating layer 106.

(4) Formation of Impurity Semiconductor Layer and Wiring Layer

Figure 22:
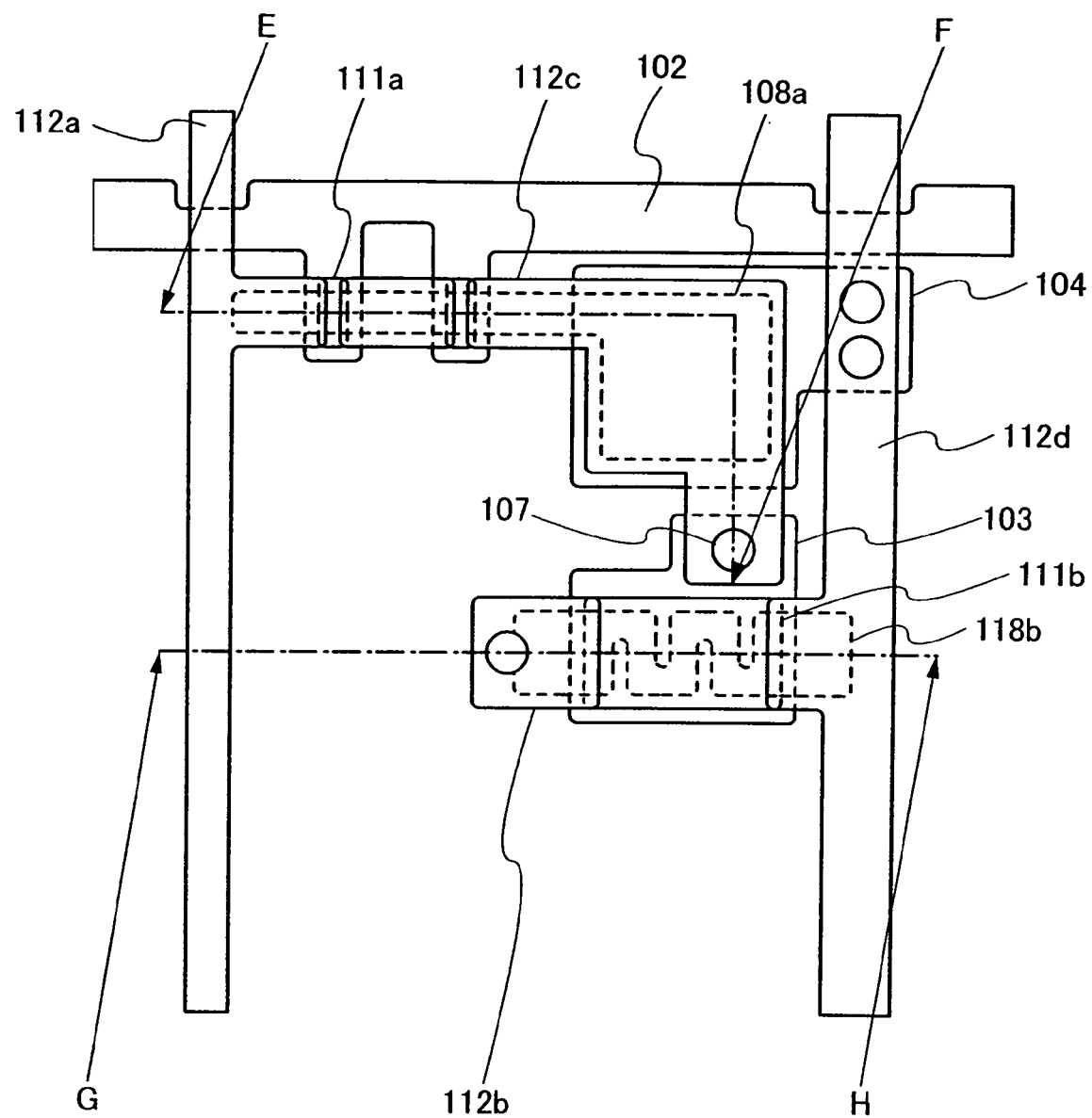
FIG. 22 is a plan view showing a manufacturing step of a display device including a TFT having a channel formed of a microcrystalline semiconductor layer in Embodiment Mode 3.
Figure 27A:
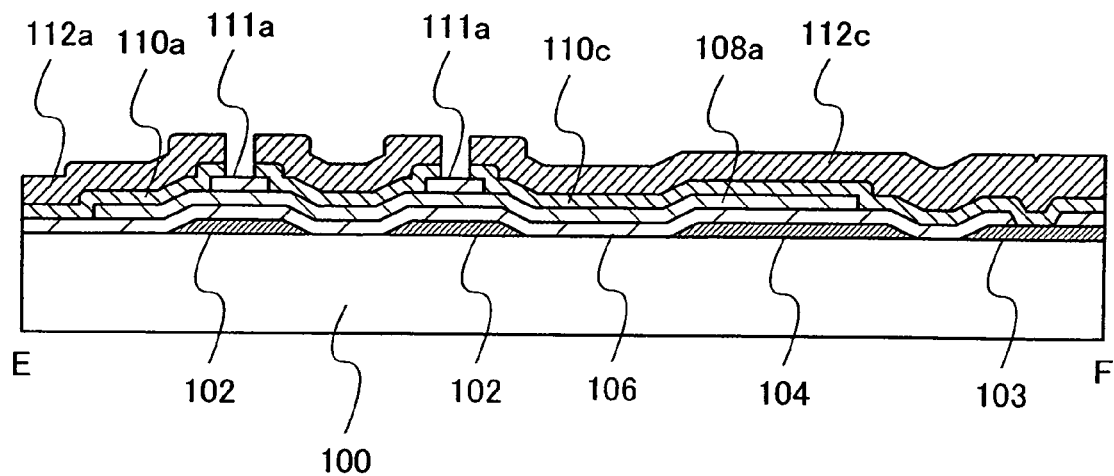
FIGS. 27A and 27B are cross-sectional views showing a manufacturing step of a display device including a TFT having a channel formed of a microcrystalline semiconductor layer in Embodiment Mode 3.
Figure 27B:
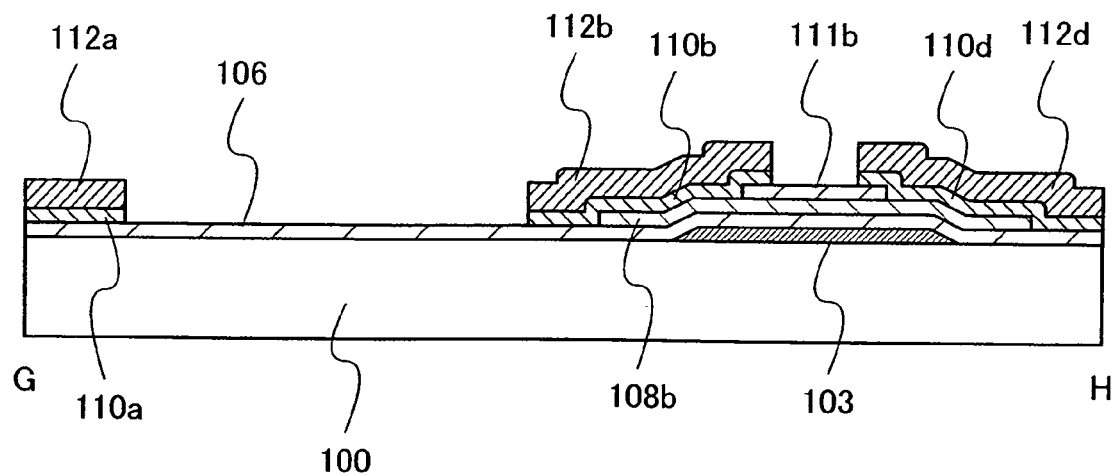
Figure 28A:
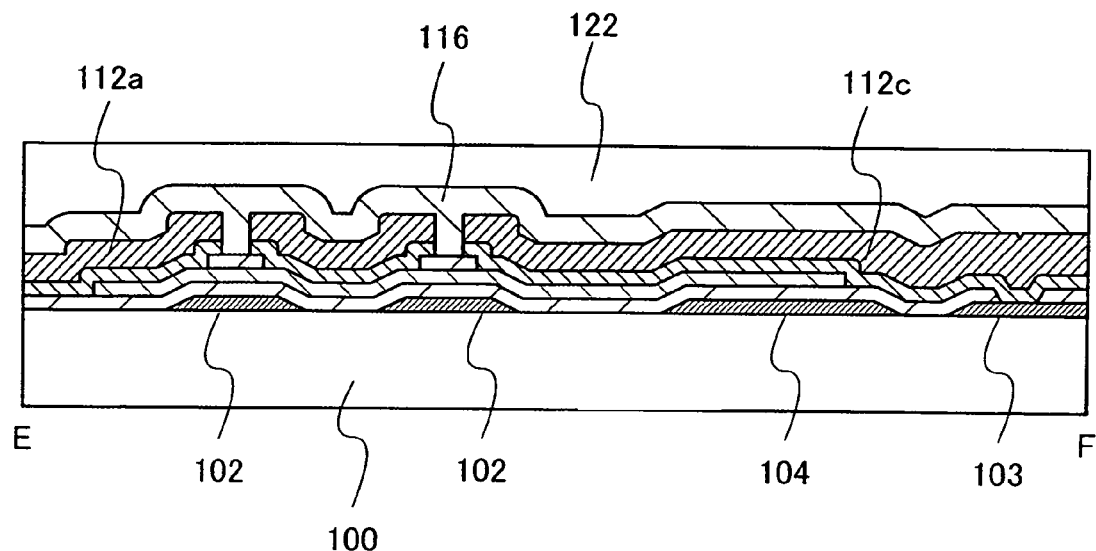
FIGS. 28A and 28B are cross-sectional views showing a manufacturing step of a display device including a TFT having a channel formed of a microcrystalline semiconductor layer in Embodiment Mode 3.
Figure 28B:
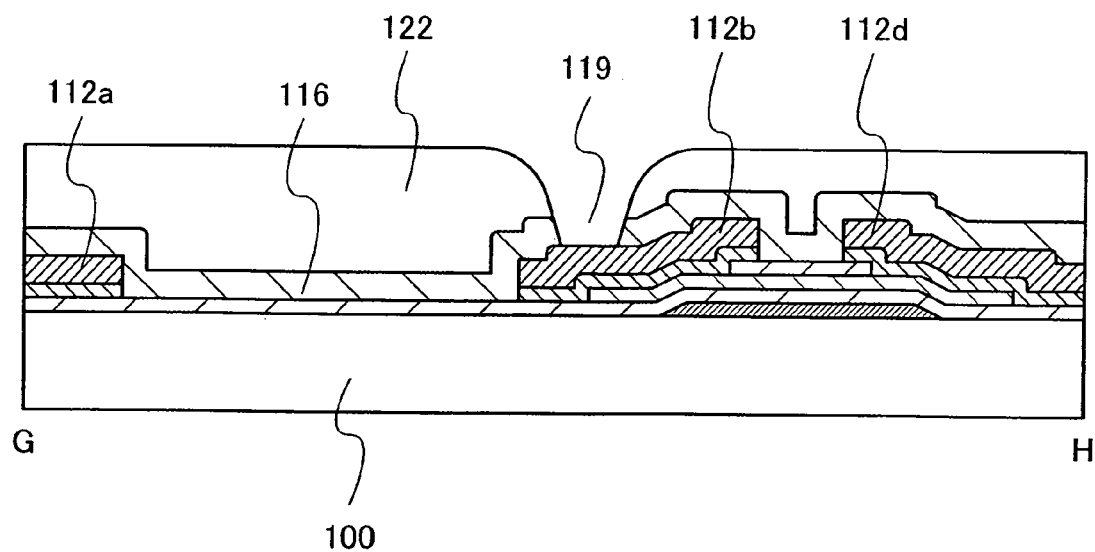

An impurity semiconductor layer 110a and a wiring layer 112a, an impurity semiconductor layer 110b and a wiring layer 112b, an impurity semiconductor layer 110c and a capacitor electrode layer 112c, and an impurity semiconductor layer 110d and a capacitor electrode layer 112d are formed using the same resist mask pattern (see FIG. 22 and FIGS. 27A and 27B). The wiring layer 112a is a wiring which intersects with the gate electrode layer 102 and also referred to as a source line or a data line. The wiring layer 112b is a wiring which connects a pixel electrode and a transistor. The capacitor electrode layer 112c is a wiring which connects two transistors provided in a pixel and is connected to the gate electrode layer 103 through the contact hole 107. In addition, the gate insulating layer 106 is formed in a region where the capacitor electrode layers 112c and 104 overlap with each other, and a storage capacitor is formed in the region.

(5) Formation of Protective Insulating Layer and Interlayer Insulating Layer

A protective insulating layer 116 and an interlayer insulating layer 122 are formed above the wiring layers 112a and 112b and the capacitor electrode layers 112c and 112d. Then, a contact hole 119 which opens the wiring layer 112b is formed (see FIGS. 28A and 28B).

(6) Formation of Pixel Electrode and Partition Insulating Layer

Figure 23:
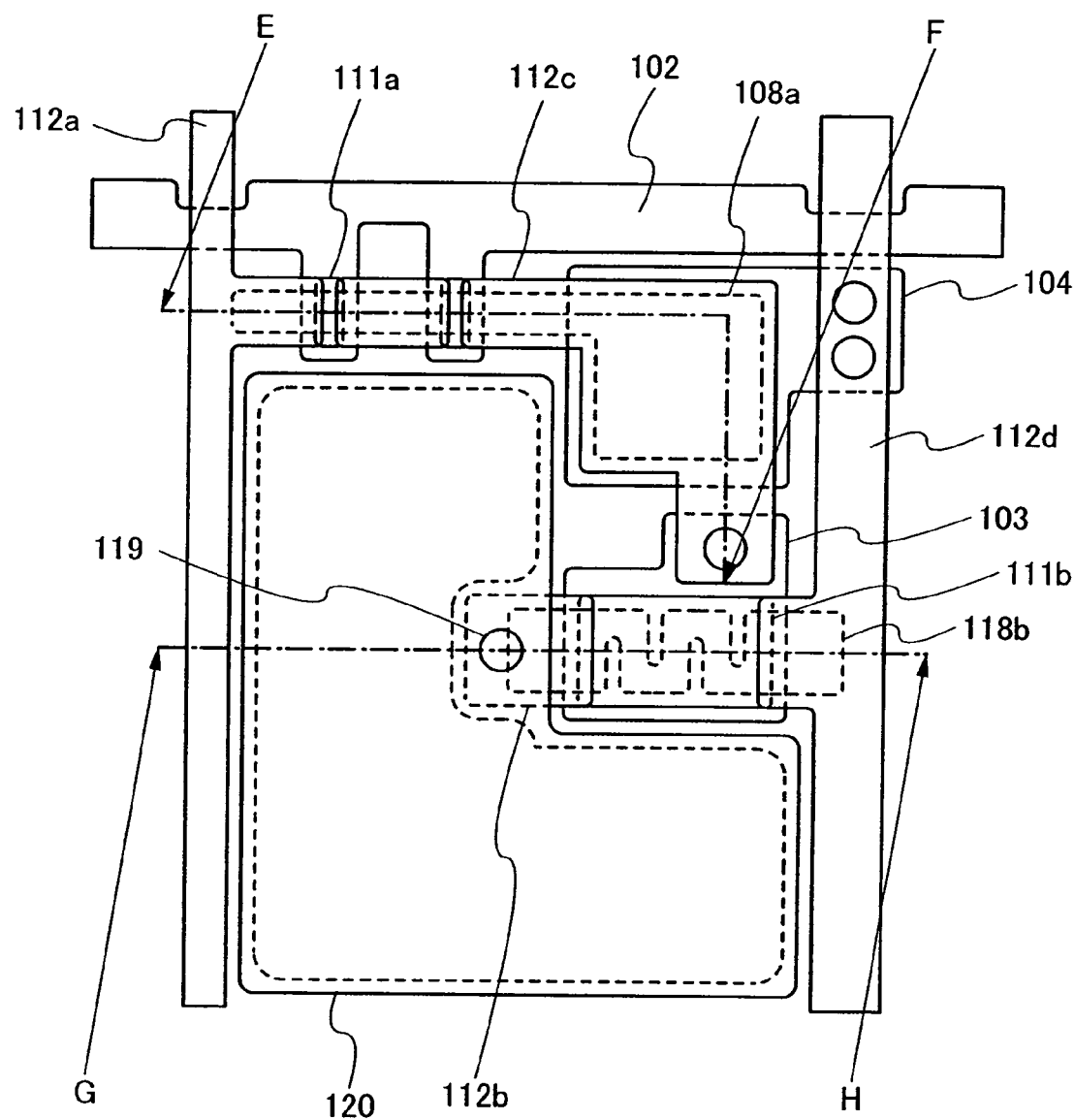
FIG. 23 is a plan view showing a manufacturing step of a display device including a TFT having a channel formed of a microcrystalline semiconductor layer in Embodiment Mode 3.
Figure 24A:
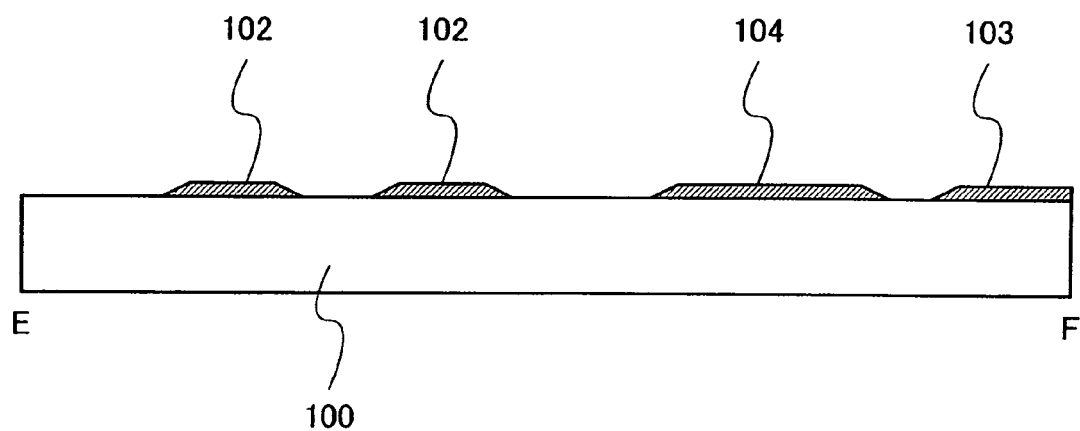
FIGS. 24A and 24B are cross-sectional views showing a manufacturing step of a display device including a TFT having a channel formed of a microcrystalline semiconductor layer in Embodiment Mode 3.
Figure 24B:
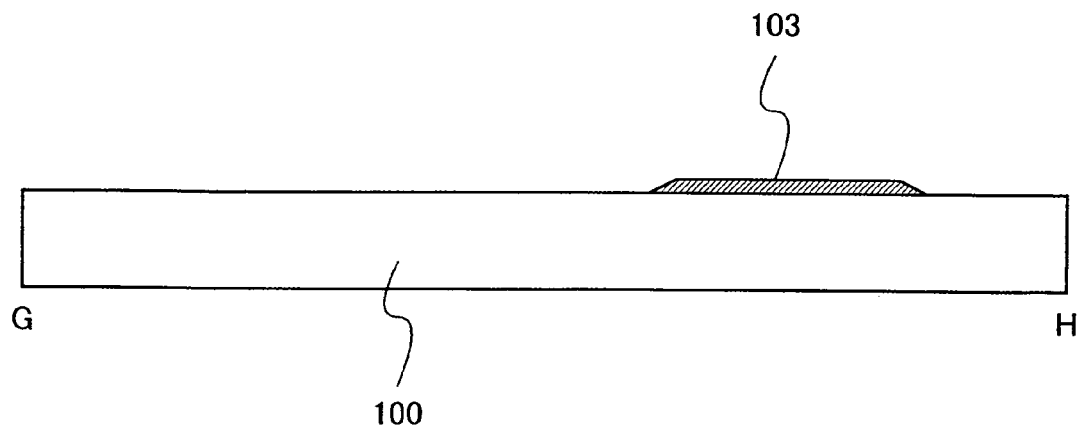
Figure 29A:
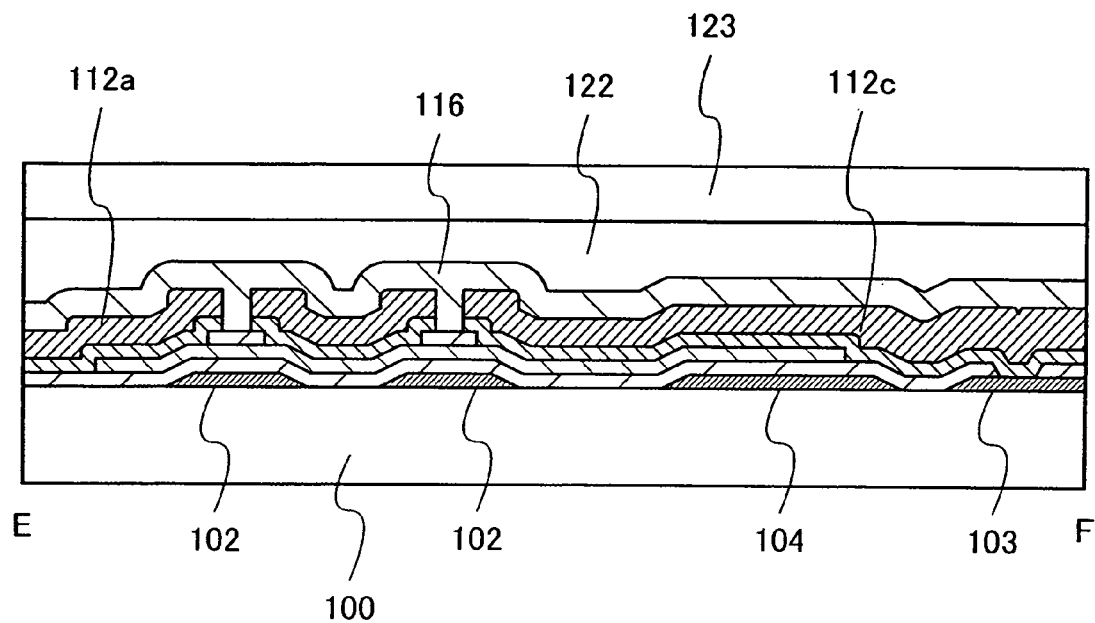
FIGS. 29A and 29B are cross-sectional views showing a manufacturing step of a display device including a TFT having a channel formed of a microcrystalline semiconductor layer in Embodiment Mode 3.
Figure 29B:
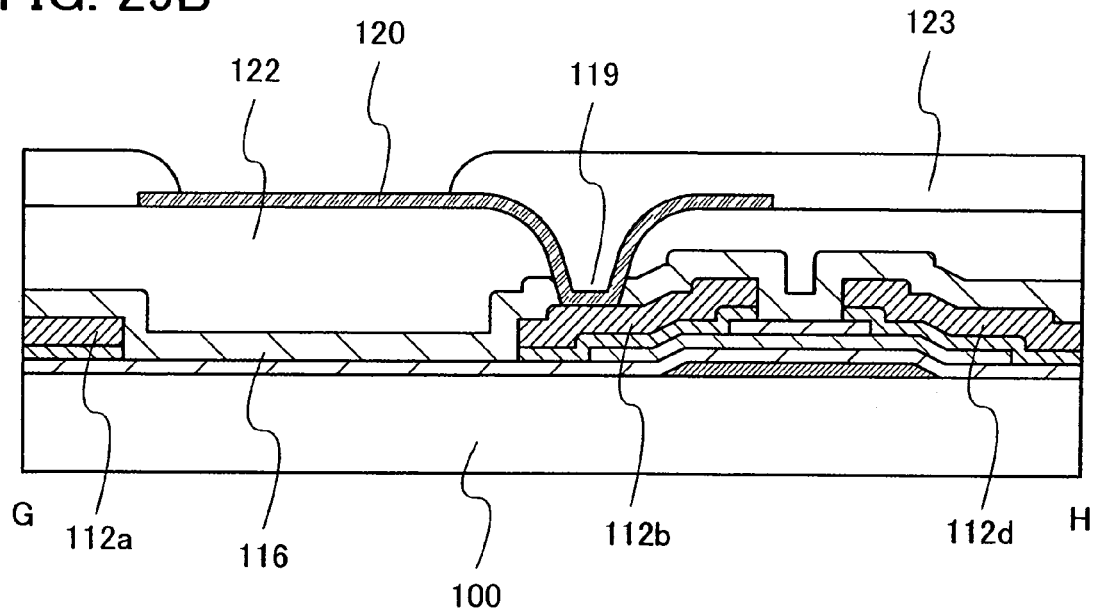

A pixel electrode 120 is formed over the interlayer insulating layer 122 (see FIG. 23 and FIGS. 29A and 29B). The pixel electrode 120 is connected to the wiring layer 112b through the contact hole 119. An insulating layer 123 is formed over the pixel electrode 120. The insulating layer 123 covers a periphery of the pixel electrode 120 and opens an inner side of the pixel electrode 120, which is formed to partition neighboring pixels.

(7) Formation of EL Layer and Counter Electrode Layer

Figure 30A:
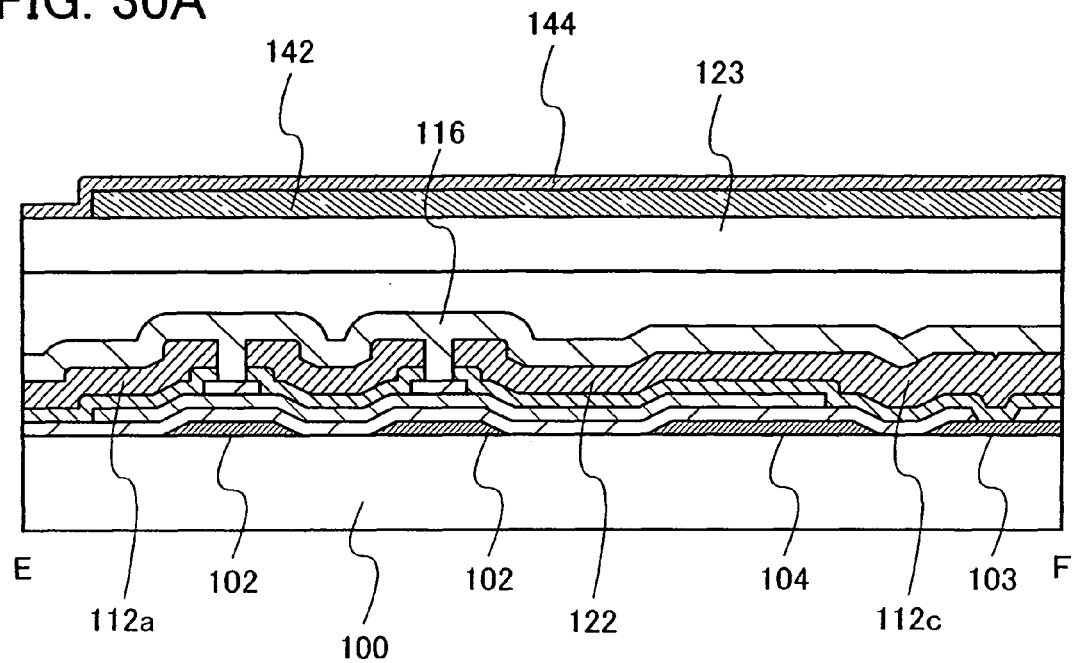
FIGS. 30A and 30B are cross-sectional views showing a manufacturing step of a display device including a TFT having a channel formed of a microcrystalline semiconductor layer in Embodiment Mode 3.
Figure 30B:
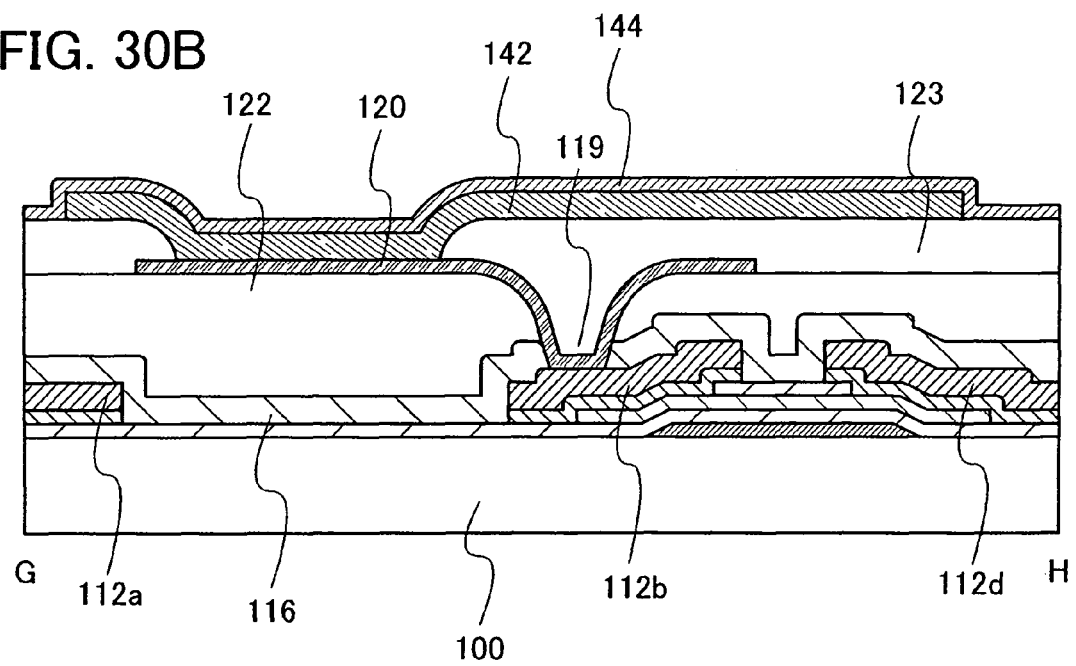

After that, an EL layer 142 and a counter electrode layer 144 are formed (see FIGS. 30A and 30B). The EL layer 142 is a layer formed to contain an electroluminescence material. A light-emitting element is formed by interposing the EL layer 142 between the pixel electrode 120 and counter electrode layer 144, and the light-emitting element is provided in each pixel. The pixel electrode 120 is formed of a non-light-transmitting electrode and the counter electrode layer 144 is formed of a light-transmitting electrode, so that a top-emission display device in which light from the light-emitting element is emitted through the counter electrode layer 144 can be formed. In addition, the pixel electrode 120 is formed of a light-transmitting electrode and the counter electrode layer 144 is formed of a non-light-transmitting electrode, so that a bottom-emission display device in which light from the light-emitting element is emitted through the pixel electrode 120 can be formed.

According to this embodiment mode, since a channel of the TFT is formed of a microcrystalline semiconductor, variation of a threshold voltage of the TFT is suppressed and operational stability of the display device in which each pixel is provided with a light-emitting element can be secured. Formation of the microcrystalline semiconductor layer can be performed by a plasma CVD method and does not need a step of laser crystallization unlike formation of a polysilicon semiconductor layer; thus, productivity is not impaired. There is a case in which crystalline specks are easily generated in the laser crystallization, which has an adverse effect on TFT characteristics and becomes the cause of luminance variation. However, since the microcrystalline semiconductor layer can be formed uniformly according to this embodiment mode, there is a characteristic that a light-emitting element is hardly affected by display unevenness due to luminance variation.

[Embodiment Mode 4]

Figure 31:
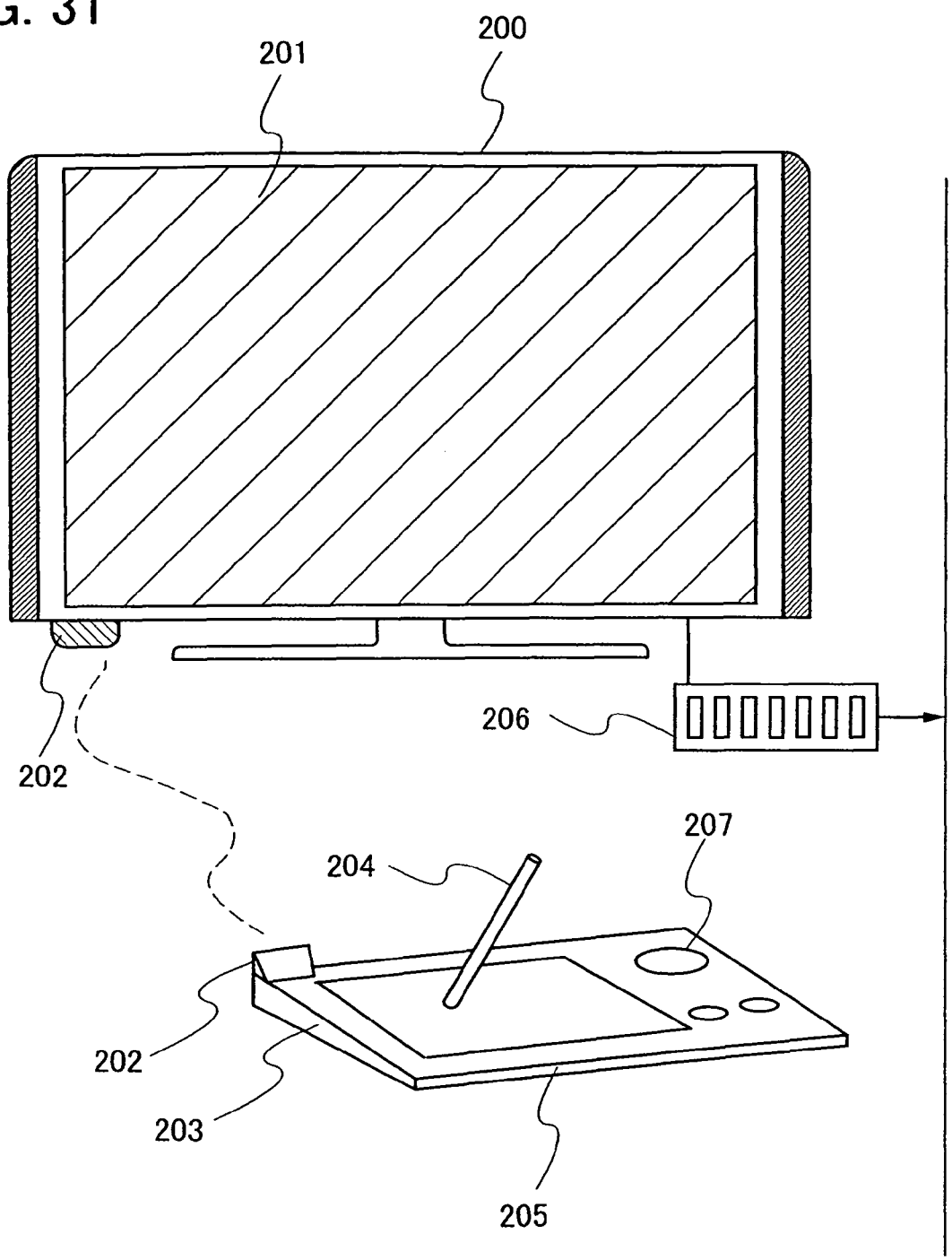
FIG. 31 is a view showing a mode of application modes of a display device.

The display devices exemplified in Embodiment modes 1 to 3 can be applied to various applications. FIG. 31 shows an example thereof, which is a display device connected to an information network typified by the Internet. A display device 200 has a display panel 201 in which a pixel includes a TFT having a channel formed of a microcrystalline semiconductor layer. The display device 200 is connected to a communication network through, for example, an adaptor 206 for connecting a network. The display device 200 can select a display image or the like by an operation board 203. The operation board 203 has an input portion 205. A system in which information is inputted by a keyboard, a pointing device such as a mouse, or a pen 204 as shown in FIG. 31 may be employed for the input portion 205. In addition, an audio input portion 207 is provided so that an intuitive operation system such as pen input or an audio identification function can be employed. The operation board 203 can be connected to the display device 200 by a wireless communication system 202 using an infrared ray or an electric wave. Information can be transmitted and received by the operation board 203 while the information which is transmitted and received is displayed on the display device 200. Since the display device 200 has the display panel 201 in which a pixel includes a TFT having a channel formed of a microcrystalline semiconductor layer, it is possible to form a high-definition screen, and images having high information density can be selected freely and enjoyed.

The present application is based on Japanese Patent Application serial No. 2007-196189 filed with Japan Patent Office on Jul. 27, 2007, the entire contents of which are hereby incorporated by reference.

What is claimed is:

1. A method for manufacturing a display device comprising the steps of:
    providing a substrate in a treatment chamber;
    supplying a reactive gas to the treatment chamber;
    supplying a microwave from a first slit formed on a side surface of a first waveguide and a second slit formed on a side surface of a second waveguide to a region between the first waveguide and the second waveguide;
    generating plasma at the region by using a plasma generator provided between the first waveguide and the second waveguide; and
    forming a microcrystalline semiconductor layer over the substrate placed in the treatment chamber,
    wherein the first waveguide and the second waveguide are provided in the treatment chamber and are aligned in parallel to each other, and
    wherein the first slit and the second slit are provided so as to face each other.

2. The method for manufacturing a display device according to claim 1, wherein the plasma has an electron density of $1\times10^{11}$ cm$^{-3}$ or more and $1\times10^{13}$ cm$^{-3}$ or less and an electron temperature of 0.2 eV or more and 2.0 eV or less.

3. The method for manufacturing a display device according to claim 1,
    wherein each of the first slit and the second slit is clogged with a dielectric plate.

4. The method for manufacturing a display device according to claim 1,
    wherein the reactive gas containing helium contains helium and a Semiconductor material gas, the method further comprising:
    providing the treatment chamber with a plurality of nozzles;
    flowing helium from one of the plurality of nozzles; and
    flowing the semiconductor material gas from another of the plurality of nozzles.

5. The method for manufacturing a display device according to claim 1,
    wherein the display device is a liquid crystal display device.

6. The method for manufacturing a display device according to claim 1, wherein a pressure of the treatment chamber is held at a pressure of $1\times10^2$ Pa or more and $1\times10^5$ Pa or less.

7. The method for manufacturing a display device according to claim 1, further comprising a step of forming a display panel including the microcrystalline semiconductor layer.

8. A method for manufacturing a display device comprising the steps of:
    providing a substrate in a treatment chamber;
    supplying a reactive gas to the treatment chamber;
    forming a gate insulating layer;
    supplying a microwave from a first slit formed on a side surface of a first waveguide and a second slit formed on a side surface of a second waveguide to a region between the first waveguide and the second waveguide;
    generating plasma at the region by using a plasma generator provided between the first waveguide and the second waveguide;
    forming a microcrystalline semiconductor layer over the substrate placed in the treatment chamber; and
    forming an impurity semiconductor layer,
    wherein the first waveguide and the second waveguide are provided in the treatment chamber and are aligned in parallel to each other,
    wherein the first slit and the second slit are provided so as to face each other, wherein the gate insulating layer, the microcrystalline semiconductor layer, and the impurity semiconductor layer are successively formed over a gate electrode, and wherein interfaces among the gate insulating layer, the microcrystalline semiconductor layer, and the impurity semiconductor layer are not exposed to atmosphere.

9. The method for manufacturing a display device according to claim 8, wherein the plasma has an electron density of $1\times10^{11}$ cm$^{-3}$ or more and $1\times10^{13}$ cm$^{-3}$ or less and an electron temperature of 0.2 eV or more and 2.0 eV or less.

10. The method for manufacturing a display device according to claim 8, wherein each of the first slit and the second slit is clogged with a dielectric plate.

11. The method for manufacturing a display device according to claim 8, wherein the reactive gas containing helium contains helium and a semiconductor material gas, the method further comprising:

providing the treatment chamber with a plurality of nozzles;

flowing helium from one of the plurality of nozzles; and flowing the semiconductor material gas from another of the plurality of nozzles.

12. The method for manufacturing a display device according to claim 8, wherein the display device is a liquid crystal display device.

13. The method for manufacturing a display device according to claim 8, wherein a pressure of the treatment chamber is held at a pressure of $1\times10^{2}$ Pa or more and $1\times10^{5}$ Pa or less.

14. A method for manufacturing a display device comprising the steps of:

providing a substrate in a treatment chamber;

supplying a reactive gas containing a rare gas to the treatment chamber;

supplying a microwave from a first slit formed on a side surface of a first waveguide and a second slit formed on a side surface of a second waveguide to a region between the first waveguide and the second waveguide;

generating plasma at the region by using a plasma generator provided between the first waveguide and the second waveguide;

forming a microcrystalline semiconductor layer over the substrate placed in the treatment chamber; and separating the rare gas from the reactive gas passed through the treatment chamber, wherein the first waveguide and the second waveguide are provided in the treatment chamber and are aligned in parallel to each other, and wherein the first slit and the second slit are provided so as to face each other.

15. The method for manufacturing a display device according to claim 14, wherein the plasma has an electron density of $1\times10^{11}$ cm$^{-3}$ or more and $1\times10^{13}$ cm$^{-3}$ or less and an electron temperature of 0.2 eV or more and 2.0 eV or less.

16. The method for manufacturing a display device according to claim 14, wherein each of the first slit and the second slit is clogged with a dielectric plate.

17. The method for manufacturing a display device according to claim 14, wherein the reactive gas containing the rare gas contains helium and a semiconductor material gas, the method further comprising:

providing the treatment chamber with a plurality of nozzles;

flowing the helium from one of the plurality of nozzles; and flowing the semiconductor material gas from another of the plurality of nozzles.

18. The method for manufacturing a display device according to claim 14, wherein the display device is a liquid crystal display device.

19. The method for manufacturing a display device according to claim 14, wherein a pressure of the treatment chamber is held at a pressure of $1\times10^{2}$ Pa or more and $1\times10^{5}$ Pa or less.

20. The method for manufacturing a display device according to claim 14, further comprising a step of forming a display panel including the microcrystalline semiconductor layer.

21. A method for manufacturing a display device comprising the steps of:

providing a substrate in a treatment chamber;

supplying a reactive gas containing a rare gas to the treatment chamber;

forming a gate insulating layer;

supplying a microwave from a first slit formed on a side surface of a first waveguide and a second slit formed on a side surface of a second waveguide to a region between the first waveguide and the second waveguide;

generating plasma at the region by using a plasma generator provided between the first waveguide and the second waveguide;

forming a microcrystalline semiconductor layer over the substrate placed in the treatment chamber;

forming an impurity semiconductor layer; and separating the rare gas from the reactive gas passed through the treatment chamber, wherein the first waveguide and the second waveguide are provided in the treatment chamber and are aligned in parallel to each other, wherein the first slit and the second slit are provided so as to face each other, wherein the gate insulating layer, the microcrystalline semiconductor layer, and the impurity semiconductor layer are successively formed over a gate electrode, and wherein interfaces among the gate insulating layer, the microcrystalline semiconductor layer, and the impurity semiconductor layer are not exposed to atmosphere.

22. The method for manufacturing a display device according to claim 21, wherein the plasma has an electron density of $1\times10^{11}$ cm$^{-3}$ or more and $1\times10^{13}$ cm$^{-3}$ or less and an electron temperature of 0.2 eV or more and 2.0 eV or less.

23. The method for manufacturing a display device according to claim 21, wherein each of the first slit and the second slit is clogged with a dielectric plate.

24. The method for manufacturing a display device according to claim 21, wherein the reactive gas containing the rare gas contains helium and a semiconductor material gas, the method further comprising:

providing the treatment chamber with a plurality of nozzles;

flowing the helium from one of the plurality of nozzles; and flowing the semiconductor material gas from another of the plurality of nozzles.

25. The method for manufacturing a display device according to claim 21, wherein the display device is a liquid crystal display device.

26. The method for manufacturing a display device according to claim 21, wherein a pressure of the treatment chamber is held at a pressure of $1\times10^{2}$ Pa or more and $1\times10^{5}$ Pa or less.

* * * * *

UNITED STATES PATENT AND TRADEMARK OFFICE
CERTIFICATE OF CORRECTION

PATENT NO. : 8,178,398 B2
APPLICATION NO. : 12/219244
DATED : May 15, 2012
INVENTOR(S) : Shunpei Yamazaki et al.

It is certified that error appears in the above-identified patent and that said Letters Patent is hereby corrected as shown below:

At column 18, line 30, please delete "containing helium";

At column 18, line 31, "Semiconductor" should be --semiconductor--;

At column 19, line 9, "$1\times10^{13}$ cm$^{31\ 3}$" should be --$1\times10^{13}$ cm$^{-3}$--;

At column 19, line 16, please delete "containing helium";

At column 20, line 20, "wavequide" should be --waveguide--;

At column 20, line 21, "wavequide" should be --waveguide--;

At column 20, line 22, "first wavequide" should be --first waveguide--;

At column 20, line 22, "second wavequide" should be --second waveguide--;

At column 20, line 24, "wavequide" should be --waveguide--;

At column 20, line 25, "wavequide" should be --waveguide--;

At column 20, line 31, "first wavequide" should be --first waveguide--;

At column 20, line 31, "second wavequide" should be --second waveguide--.

Signed and Sealed this
Tenth Day of July, 2012

David J. Kappos
*Director of the United States Patent and Trademark Office*